(12) United States Patent
Menard et al.

(10) Patent No.: US 9,049,797 B2
(45) Date of Patent: Jun. 2, 2015

(54) ELECTRICALLY BONDED ARRAYS OF TRANSFER PRINTED ACTIVE COMPONENTS

(75) Inventors: Etienne Menard, Limoges (FR);
Christopher Bower, Raleigh, NC (US);
Matthew Meitl, Durham, NC (US);
Philip Garrou, Cary, NC (US)

(73) Assignee: Semprius, Inc., Durham, NC (US)

( * ) Notice: Subject to any disclaimer, the term of this patent is extended or adjusted under 35 U.S.C. 154(b) by 416 days.

(21) Appl. No.: 13/638,040

(22) PCT Filed: Mar. 22, 2011

(86) PCT No.: PCT/US2011/029365
§ 371 (c)(1),
(2), (4) Date: Feb. 25, 2013

(87) PCT Pub. No.: WO2011/126726
PCT Pub. Date: Oct. 13, 2011

(65) Prior Publication Data
US 2013/0153277 A1      Jun. 20, 2013

Related U.S. Application Data

(60) Provisional application No. 61/318,522, filed on Mar. 29, 2010.

(51) Int. Cl.
*H05K 7/00* (2006.01)
*H05K 1/16* (2006.01)
(Continued)

(52) U.S. Cl.
CPC ............. *H05K 1/18* (2013.01); *H01L 21/6835* (2013.01); *H01L 21/76898* (2013.01); *H01L 23/481* (2013.01); *H01L 24/02* (2013.01); *H01L 24/05* (2013.01); *H01L 24/08* (2013.01); *H01L 24/24* (2013.01); *H01L 24/27* (2013.01);
(Continued)

(58) Field of Classification Search
USPC .......... 361/760, 765, 777, 778, 783; 174/260, 174/261; 228/179.01
See application file for complete search history.

(56) References Cited

U.S. PATENT DOCUMENTS 5,882,532 A * 3/1999 Field et al. ......................... 216/2
2002/0158568 A1 * 10/2002 Satake ........................... 313/493
(Continued)

FOREIGN PATENT DOCUMENTS

| WO | WO 2005/088704 A1 | 9/2005 |
| WO | WO 2007/037106 A1 | 4/2007 |
| WO | WO 2008/143635 A1 | 11/2008 |

OTHER PUBLICATIONS

International Preliminary Report on Patentability and Written Opinion, PCT/US2011/029365 mailed Oct. 11, 2012.
(Continued)

*Primary Examiner* — Hoa C Nguyen
(74) *Attorney, Agent, or Firm* — Myers Bigel Sibley & Sajovec, PA

(57) ABSTRACT

An active component array includes a target substrate having one or more contacts formed on a side of the target substrate, and one or more printable active components distributed over the target substrate. Each active component includes an active layer having a top side and an opposing bottom side and one or more active element(s) formed on or in the top side of the active layer. The active element(s) are electrically connected to the contact(s), and the bottom side is adhered to the target substrate. Related fabrication methods are also discussed.

32 Claims, 20 Drawing Sheets

(51) Int. Cl.
   B23K 31/00    (2006.01)
   H05K 1/18    (2006.01)
   H01L 21/683    (2006.01)
   H01L 21/768    (2006.01)
   H01L 23/48    (2006.01)
   H01L 27/12    (2006.01)
   H01L 27/146    (2006.01)
   H01L 31/0203    (2014.01)
   H01L 31/048    (2014.01)
   H05K 13/04    (2006.01)
   H01L 23/00    (2006.01)
   H01S 5/022    (2006.01)

(52) U.S. Cl.
   CPC ............... *H01L 24/29* (2013.01); *H01L 24/30* (2013.01); *H01L 24/32* (2013.01); *H01L 24/73* (2013.01); *H01L 24/82* (2013.01); *H01L 24/83* (2013.01); *H01L 24/92* (2013.01); *H01L 27/1214* (2013.01); *H01L 27/1266* (2013.01); *H01L 27/14618* (2013.01); *H01L 2221/6835* (2013.01); *H01L 2221/68372* (2013.01); *H01L 2221/68381* (2013.01); *H01L 2224/02371* (2013.01); *H01L 2224/02372* (2013.01); *H01L 2224/0239* (2013.01); *H01L 2224/04026* (2013.01); *H01L 2224/05548* (2013.01); *H01L 2224/056* (2013.01); *H01L 2224/08238* (2013.01); *H01L 2224/24011* (2013.01); *H01L 2224/24137* (2013.01); *H01L 2224/24147* (2013.01); *H01L 2224/24226* (2013.01); *H01L 2224/245* (2013.01); *H01L 2224/24998* (2013.01); *H01L 2224/2731* (2013.01); *H01L 2224/29078* (2013.01); *H01L 2224/291* (2013.01); *H01L 2224/2919* (2013.01); *H01L 2224/2929* (2013.01); *H01L 2224/29344* (2013.01); *H01L 2224/3012* (2013.01); *H01L 2224/32104* (2013.01); *H01L 2224/32146* (2013.01); *H01L 2224/32227* (2013.01); *H01L 2224/73267* (2013.01); *H01L 2224/76155* (2013.01); *H01L 2224/80203* (2013.01); *H01L 2224/80224* (2013.01); *H01L 2224/821* (2013.01); *H01L 2224/82106* (2013.01); *H01L 2224/83093* (2013.01); *H01L 2224/83121* (2013.01); *H01L 2224/83191* (2013.01); *H01L 2224/83192* (2013.01); *H01L 2224/83805* (2013.01); *H01L 2224/83815* (2013.01); *H01L 2224/8384* (2013.01); *H01L 2224/83851* (2013.01); *H01L 2224/83855* (2013.01); *H01L 2224/83859* (2013.01); *H01L 2224/83862* (2013.01); *H01L 2224/83868* (2013.01); *H01L 2224/83871* (2013.01); *H01L 2224/83874* (2013.01); *H01L 2224/92244* (2013.01); *H01L 2924/01013* (2013.01); *H01L 2924/01029* (2013.01); *H01L 2924/01032* (2013.01); *H01L 2924/01047* (2013.01); *H01L 2924/01049* (2013.01); *H01L 2924/0105* (2013.01); *H01L 2924/01057* (2013.01); *H01L 2924/01079* (2013.01); *H01L 2924/01082* (2013.01); *H01L 2924/10329* (2013.01); *H01L 2924/12044* (2013.01); *H01S 5/02236* (2013.01); *H01S 5/02276* (2013.01); *H01L 31/0203* (2013.01); *H01L 31/048* (2013.01); *H01L 2924/01005* (2013.01); *H01L 2924/01006* (2013.01); *H01L 2924/01023* (2013.01); *H01L 2924/01033* (2013.01); *H01L 2924/01075* (2013.01); *H01L 2924/01322* (2013.01); *H01L 2924/014* (2013.01); *H01L 2224/29101* (2013.01); *H01L 2924/0132* (2013.01); *H01L 2924/0133* (2013.01); *H01L 2224/29111* (2013.01); *H05K 13/04* (2013.01); *H05K 13/046* (2013.01); *Y02E 10/50* (2013.01); *H01L 2224/82007* (2013.01); *H01L 2924/15787* (2013.01); *H01L 2224/82102* (2013.01)

(56) References Cited

U.S. PATENT DOCUMENTS

| | | | |
|---|---|---|---|
| 2004/0082163 A1* | 4/2004 | Mori et al. | 438/630 |
| 2004/0130020 A1* | 7/2004 | Kuwabara et al. | 257/723 |
| 2004/0227886 A1 | 11/2004 | Kimura | |
| 2005/0040754 A1* | 2/2005 | Sakurai | 313/500 |
| 2007/0032089 A1 | 2/2007 | Nuzzo et al. | |
| 2007/0120681 A1* | 5/2007 | Yamazaki et al. | 340/572.8 |
| 2007/0254455 A1 | 11/2007 | Yamaguchi et al. | |
| 2010/0072495 A1* | 3/2010 | Yamazaki | 257/89 |
| 2012/0314388 A1* | 12/2012 | Bower et al. | 361/760 |

OTHER PUBLICATIONS

International Search Report and Written Opinion, PCT/US2011/029365 mailed Sep. 20, 2011.

\* cited by examiner

US 9,049,797 B2

ELECTRICALLY BONDED ARRAYS OF TRANSFER PRINTED ACTIVE COMPONENTS

CLAIM OF PRIORITY

The present application is a 35 U.S.C. §371 national phase application of PCT International Application No. PCT/US2011/029365, entitled "Electrically Bonded Arrays Of Transfer Printed Active Components", having an international filing date of Mar. 22, 2011, which claims priority from U.S. Provisional Patent Application No. 61/318,522 entitled "Active Backplane," filed on Mar. 29, 2010 with the United States Patent and Trademark Office, the disclosures of which are incorporated by reference herein in their entireties. The above PCT International Application was published in the English language and has International Publication No. WO 2011/126726 A1.

FIELD OF THE INVENTION

The present invention is an apparatus and method for providing a target substrate with electrically active components distributed thereon.

BACKGROUND OF THE INVENTION

Large substrates with electronically active components distributed over the extent of the substrate may be used in a variety of electronic systems, for example imaging devices such as flat-panel liquid crystal or OLED display devices and/or in digital radiographic plates. Large substrates with electrically active components are also found in flat-panel solar cells.

The electronically active components on flat-panel substrates are typically formed by sputtering a layer of inorganic semiconductor material or by spin-coating organic material over the entire substrate and processing the layer to form electronic components. However, such coatings typically have relatively poor electronic characteristics. Inorganic semi-conductor materials can be processed to improve their electronic characteristics, for example amorphous silicon can be treated to form low-temperature or high-temperature poly-crystalline silicon. In other process methods, microcrystalline semiconductor layers can be formed by used an underlying seeding layer. These methods typically improve the electron mobility of the semiconductor, but the performance of the resulting layer may still be worse than is often desirable. The substrate and layer of semiconductor material are typically photo-lithographically processed to define electronically active components, such as transistors. Such transistors are known as thin-film transistors (TFTs) since they are formed in a thin layer of semiconductor material, typically silicon. In these devices, the substrate is often made of glass, for example Corning® Eagle® or Jade™ glass designed for display applications. Photo-lithographic methods used to form the active components are known in the art.

These traditional techniques have some significant limitations. Despite processing methods used to improve the performance of thin-film transistors, such transistors have a performance lower than the performance of traditional integrated circuits formed in mono-crystalline semiconductor material. Semiconductor material and active components can be desired only on portions of the substrate, leading to wasted material and increased material and processing costs. The substrate materials can be limited by processing steps that may be necessary to process the semiconductor material and the photo-lithographic steps that may be used to pattern the active components. For example, plastic substrates have a relatively limited chemical and heat tolerance and do not typically survive photo-lithographic processing. Furthermore, the manufacturing equipment needed to process large substrates with thin-film circuitry is relatively expensive.

In an alternative manufacturing technique, a mono-crystalline semiconductor wafer is employed as the substrate. While this approach can provide substrates with similar performance as integrated circuits, the size of such substrates is typically limited, for example, to a 12-inch diameter circle, and the wafers are relatively expensive compared to other substrate materials such as glass or polymer.

In yet another approach, thin layers of semiconductor are bonded to a substrate and then processed. Such a method is known as semiconductor-on-glass or silicon-on-glass (SOG) and is described, for example, in U.S. Patent Application Publication No. 2008/0224254, dated Sep. 18, 2004. If the semiconductor material is crystalline, high-performance thin-film circuits can be obtained. However, the bonding technique can be expensive, and the processing equipment for the substrates to form the thin-film active components on large substrates remains relatively expensive.

Also, it relatively large integrated circuits can be provided in a surface mountable package that is directly adhered to a substrate. However, these integrated circuits are relatively large and additional layers may not be easily formed over the integrated circuits.

Publication number 11-142878 of the Patent Abstracts of Japan entitled "Formation of Display Transistor Array Panel" describes etching a substrate to remove it from a thin-film transistor array on which the TFT array was formed. TFT circuits formed on a first substrate can be transferred to a second substrate by adhering the first substrate and the TFTs to the surface of the second substrate and then etching away the first substrate, leaving the TFTs bonded to the second substrate. However this method requires etching a significant quantity of material and risks damaging the exposed TFT array.

An alternative method of locating material on a substrate is described in U.S. Pat. No. 7,127,810. In this method, a first substrate carries a thin-film object to be transferred to a second substrate. An adhesive is applied to the object to be transferred or to the second substrate in the desired location of the object. The substrates are aligned and brought into contact. A laser beam irradiates the object to abrade the transferring thin film so that the transferring thin film adheres to the second substrate. The first and second substrates are separated, peeling the film in the abraded areas from the first substrate and transferring it to the second substrate. In one embodiment, a plurality of objects is selectively transferred by employing a plurality of laser beams to abrade selected areas. Objects to be transferred can include thin-film circuits.

U.S. Pat. No. 6,969,624 describes a method of transferring a device from a first substrate onto a holding substrate by selectively irradiating an interface with an energy beam. The interface is located between a device for transfer and the first substrate and includes a material that generates ablation upon irradiation, thereby releasing the device from the substrate. For example, a light-emitting device (LED) is made of a nitride semiconductor on a sapphire substrate. The energy beam is directed to the interface between the sapphire substrate and the LED nitride semiconductor releasing the LED and allowing the LED to adhere to a holding substrate coated with an adhesive. The adhesive is then cured. These methods, however, require the patterned deposition of adhesive on the object(s) or on the second substrate. Moreover, the laser beam that irradiates the object is typically shaped to match the shape of the object, and the laser abrasion can damage the object to be transferred. Furthermore, the adhesive cure takes time, which can reduce the throughput of the manufacturing system.

In another method for transferring active components from one substrate to another, described in "AMOLED Displays using Transfer-Printed Integrated Circuits" published in the Proceedings of the 2009 Society for Information Display International Symposium Jun. 2-5, 2009, in San Antonio Tex., US, vol. 40, Book 2, ISSN 0009-0966X, paper 63.2 p. 947, small integrated circuits are formed in a wafer and released from the wafer by etching beneath the circuits. A PDMS stamp is pressed against the wafer and the circuits adhered to the stamp. The circuits are then pressed against a substrate coated with an adhesive, adhered to the substrate, and the adhesive is subsequently cured. This method, however, requires the construction of conductive metal traces over both the integrated circuits and substrate. Because the integrated circuits have a relatively large relief profile, for example 10 microns, forming such connections can be difficult. Furthermore, forming the conductive metal traces after the integrated circuits are adhered to the substrates typically subjects the integrated circuits and substrate to photo-lithographic processing steps and can require additional layers of material.

SUMMARY OF THE INVENTION

It should be appreciated that this Summary is provided to introduce a selection of concepts in a simplified form, the concepts being further described below in the Detailed Description. This Summary is not intended to identify key features or essential features of this disclosure, nor is it intended to limit the scope of the disclosure.

According to some embodiments of the present invention, an active component array includes a plurality of printable electronic components, where each of the electronic components includes an active layer having at least one active element on a first surface thereof and a conductive element on a second surface thereof opposite the first surface, and where the conductive element on the second surface is configured to provide an electrical coupling to the at least one active element on the first surface. The plurality of electronic components is printed on a substrate different from the active layer, where the substrate includes electrical contacts on a surface thereof. The conductive element on the second surface of each of the electronic components is in contact with a respective one of the electrical contacts.

In some embodiments, each of the electronic components includes a tab adjacent a periphery thereof, where the tab comprises a broken portion of a tether configured to releasably adhere the respective electronic component to an anchor portion of the active layer on a source substrate.

In some embodiments, the substrate comprises a target substrate, and, in each of the electronic components, the first surface is configured to be adhered to a stamp to transfer the respective electronic component from the source substrate to the target substrate.

In some embodiments, the array further includes an adhesive layer between the second surface of each of the electronic components and the surface of the substrate.

In some embodiments, the adhesive layer comprises a conductive layer between the conductive element of each of the electronic components and the respective one of the electrical contacts.

In some embodiments, the adhesive layer comprises a material configured to transition between a nonconductive state and a conductive state responsive to curing thereof.

In some embodiments, the adhesive layer comprises a eutectic layer, a conductive film, and/or conductive nanoparticles.

In some embodiments, each of the electronic components includes a via extending therethrough from the first surface to the second surface, and the conductive element extends through the via from the at least one active component on the first surface to the second surface.

In some embodiments, in each of the electronic components, the conductive element protrudes from the second surface.

In some embodiments, in each of the electronic components, the conductive element extends from the at least one active component on the first surface to the second surface around a periphery of the active layer.

In some embodiments, in each of the electronic components, the conductive element is a diode comprising a first doped layer and a second doped layer having a conductivity type opposite that of the first doped layer.

In some embodiments, the substrate comprises a target substrate including conductive traces thereon, and ones of the conductive traces are coupled to ones of the electrical contacts.

In some embodiments, the substrate comprises a flexible and/or a polymer substrate.

In some embodiments, the active layer comprises a crystalline, microcrystalline, polycrystalline, or amorphous semiconductor layer.

In some embodiments, the substrate including the plurality of electronic components printed thereon defines a surface mount package for a chip-level device.

According to further embodiments of the present invention, a method of fabricating an active component array includes providing a plurality of printable electronic components, where each of the electronic components includes an active layer having at least one active element on a first surface thereof and a conductive element on a second surface thereof opposite the first surface, and where the conductive element on the second surface is configured to provide an electrical coupling to the at least one active element on the first surface; and printing the plurality of electronic components on a substrate different from the active layer and including electrical contacts on a surface thereof such that the conductive element on the second surface of each of the electronic components is in contact with a respective one of the electrical contacts.

In some embodiments, each of the electronic components includes a tab adjacent a periphery thereof, where the tab comprises a broken portion of a tether configured to releasably adhere the respective electronic component to an anchor portion of the active layer on a source substrate.

In some embodiments, the substrate comprises a target substrate, and printing the plurality of electronic components on the target substrate includes: providing the plurality of electronic components releasably adhered to the source substrate by respective tethers; pressing a stamp on the source substrate to break the respective tethers and adhere the first surface of each of the electronic components to the stamp; aligning the stamp including the plurality of electronic components thereon with the electrical contacts on the surface of the target substrate; pressing the stamp on the target substrate such that the conductive element on the second surface of each of the electronic components contacts a respective one of the electrical contacts on the surface of the target substrate;

and separating the stamp from the target substrate to print the plurality of electrical components thereon.

In some embodiments, providing the plurality of electronic components includes: providing the source substrate including a sacrificial layer thereon and the active layer on the sacrificial layer; processing the active layer to define the plurality of electronic components respectively including the at least one active element on the first surface thereof, respective trenches extending around each of the electronic components, and the respective tethers connecting each of the electronic components to respective anchor portions of the active layer; and removing portions of the sacrificial layer between the plurality of electronic components and the source substrate such that the plurality of electronic components are releasably adhered to the source substrate by the respective tethers.

In some embodiments, pressing the stamp on the target substrate is preceded by providing an adhesive layer between the second surface of each of the electronic components and the surface of the target substrate.

In some embodiments, the adhesive layer comprises a conductive layer provided between the conductive element of each of the electronic components and the respective one of the electrical contacts on the target substrate.

In some embodiments, separating the stamp from the target substrate is preceded by curing the adhesive layer to adhere the plurality of electronic components to the target substrate, where an adhesive strength of the adhesive layer is greater than that used to adhere the first surface of each of the electronic components to the stamp.

In some embodiments, the adhesive layer comprises a material configured to transition between a nonconductive state and a conductive state responsive to the curing thereof.

In some embodiments, curing comprises selectively irradiating portions of the adhesive layer through the target substrate, the stamp, and/or the electronic components using light, heat, and/or electromagnetic energy.

In some embodiments, the adhesive layer comprises a eutectic layer, an anisotropic conductive film, and/or conductive nano-particles.

In some embodiments, the conductive nano-particles are provided in a colloid, and the colloid is deposited on the surface of the target substrate using an inkjet dispenser or micro-dispenser to define the adhesive layer.

In some embodiments, each of the electrical contacts includes a eutectic layer, and the eutectic layer is reflowed after pressing the stamp on the target substrate such that the conductive element on the second surface of each of the electronic components is in contact with the respective one of the electrical contacts According to still further embodiments of the present invention, an active component array comprises: a target substrate having one or more contacts formed on a side of the target substrate; and one or more active components distributed over the target substrate, each active component including an active layer having a top side and an opposing bottom side and one or more active element(s) formed on or in the top side of the active layer, wherein the active element(s) are electrically connected to the contact(s), and wherein the bottom side is adhered to the target substrate.

In some embodiments, the array further includes: a via formed through the active layer and located over, and aligned with, at least one contact; and a metal layer formed on at least a portion of the via extending over at least a portion of the top side of the active component, the metal layer being in electrical communication with at least one active element and at least one contact.

In some embodiments, the array further includes a metal layer formed on at least a portion of the top side of the active component, the side of the active component, and the bottom side of the active component, the metal layer being in electrical communication with at least one active element and with at least one contact.

In some embodiments, the active layer includes a first doped semiconductor layer formed on the bottom side of the active component, a semiconductor layer formed between the first doped semiconductor and the active element(s), and a second doped semiconductor layer formed between the semiconductor and the active element(s), where the second doped semiconductor layer is doped with a charge opposite the doped charge of the first doped semiconductor layer.

In some embodiments, the array further includes a patterned layer formed over at least a portion of the active component and over at least a portion of the target substrate, where the patterned layer is in electrical communication with the active element(s). In some embodiments, the patterned layer forms conductive traces that are in electrical contact with an active element.

In some embodiments, the array further includes an adhesive formed over at least a portion of the active component and at least a portion of the target substrate separate from the active component.

In some embodiments, the array further includes an electrically conductive material located between and in electrical communication with the metal layer and a contact.

In some embodiments, the electrically conductive material adheres the active component to the target substrate.

In some embodiments, the electrically conductive material is a eutectic material.

In some embodiments, the electrically conductive material is an unpatterned anisotropic conductive film.

In some embodiments, the active element(s) includes electronic circuitry.

In some embodiments, the active layer is a crystalline semiconductor. According to yet further embodiments of the present invention, a method of making an active component array comprises: providing a target substrate having one or more contacts formed on a side of the substrate; providing one or more active components, each active component including an active layer having a top side and an opposing bottom side and one or more active elements formed on or in the top side of the active layer, the active substrate having an electrical communication between one or more active elements and a pad on the back side of the active; distributing the one or more active components over the target substrate with the pad located over, and aligned to, at least one contact; and adhering the bottom side to the target substrate.

In some embodiments, the method further includes forming a via from the top side to the bottom side through the active layer, forming the pad with a metal layer over at least a portion of the via in electrical contact with at least one active element.

In some embodiments, the active layer is formed of a semiconductor material and the method further includes forming a first doped semiconductor layer on the bottom side of the active component, forming a semiconductor layer between the first doped semiconductor and the active element(s), and forming a second doped semiconductor layer between the semiconductor and the active element(s), wherein the second doped semiconductor layer is doped with a charge opposite the doped charge of the first doped semiconductor layer.

In some embodiments, providing and distributing the one or more active components over the target substrate further include providing an active substrate having a sacrificial layer formed over the active substrate and an active layer formed on the sacrificial layer; processing the active substrate to form one or more active components having active element(s) in or on the active layer, an electrical connection in electrical communication with one or more active element(s) and a pad located on the bottom side of the active layer, and a trench around each of the active component(s), the trench extending through the active layer to the sacrificial layer, forming separated active components; removing the sacrificial layer except for breakable tethers to release the active components from a remainder of the active substrate; pressing a stamp against the top side active component(s) to thereby break the tethers and adhere the active components to the stamp; and pressing the active components against the target substrate in alignment with the contacts to adhere the active components to the target substrate.

In some embodiments, the method further includes providing an electrically conductive adhesive over the target substrate or active components before the active components are pressed against the target substrate.

In some embodiments, the electrically conductive adhesive is cured to adhere the active component(s) to the target substrate.

In some embodiments, the electrically conductive adhesive is a eutectic material, an anisotropic conductive film, or a colloid including metal nano-particles.

In some embodiments, the method further includes depositing the colloid in a pattern with an inkjet dispenser or micro-dispenser.

In some embodiments, the method further includes curing the metal nano-particles with a laser to form an electrical conductor.

In some embodiments, the cure is done by a laser through the target substrate, through the active layer, a via in the active layer, or though a stamp used to apply the active components to the target substrate.

In some embodiments, at least one metal layer is welded to at least one contact.

In some embodiments, at least one contact includes a eutectic material or is coated with a eutectic material, and the method further includes reflowing the eutectic material.

In some embodiments, the active components are active-matrix pixel controllers, light-emitting diodes, photo-diodes, edge lasers, or photovoltaic elements.

In some embodiments, the contacts include eutectic material or have a eutectic material coating.

Embodiments of the present invention provide high-performance active components over large substrates at a reduced cost in materials and manufacturing equipment, with fewer processing steps and material layers.

Other methods and/or devices according to some embodiments will become apparent to one with skill in the art upon review of the following drawings and detailed description. It is intended that all such additional embodiments, in addition to any and all combinations of the above embodiments, be included within this description, be within the scope of the invention, and be protected by the accompanying claims.

Figure 1A:
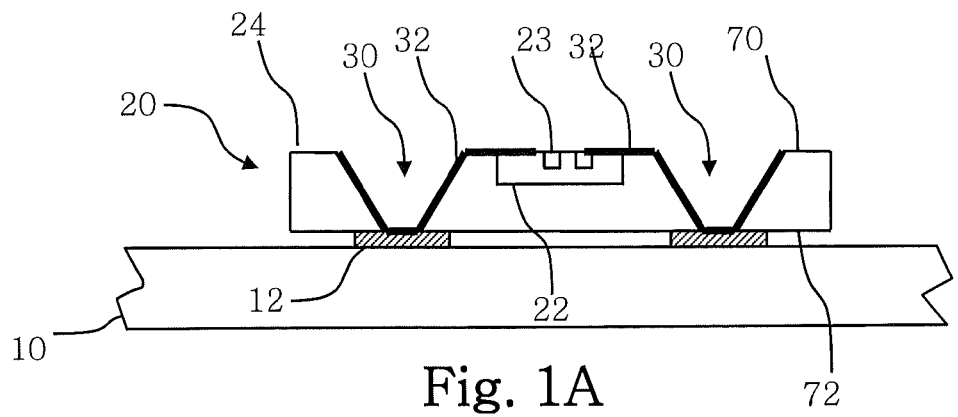
FIG. 1A is a cross section illustrating an embodiment of the present invention having a via.

The figures are not drawn to scale since the individual elements of the drawings have too great a size variation to permit depiction to scale.

DETAILED DESCRIPTION OF EMBODIMENTS OF THE INVENTION

The present invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "in contact with" or "connected to" or "coupled to" another element, it can be directly contacting or connected to or coupled to the other element or intervening elements may be present. In contrast, when an element is referred to as being "in direct contact with" or "directly connected to" or "directly coupled to" another element, there are no intervening elements present.

It will also be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

The terminology used in the description of the invention herein is for the purpose of describing particular embodiments only and is not intended to be limiting of the invention. As used in the description of the invention and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. In other words, the regions illustrated in the figures are schematic in nature and their shapes are not intended to illustrate the actual shape of a region of a device and are not intended to limit the scope of the invention.

Unless otherwise defined, all terms used in disclosing embodiments of the invention, including technical and scientific terms, have the same meaning as commonly understood by one of ordinary skill in the art to which this invention belongs, and are not necessarily limited to the specific definitions known at the time of the present invention being described. Accordingly, these terms can include equivalent terms that are created after such time. It will be further understood that terms, such as those defined in commonly used dictionaries, should be interpreted as having a meaning that is consistent with their meaning in the present specification and in the context of the relevant art and will not be interpreted in an idealized or overly formal sense unless expressly so defined herein. All publications, patent applications, patents, and other references mentioned herein are incorporated by reference in their entireties.

Figure 1B:
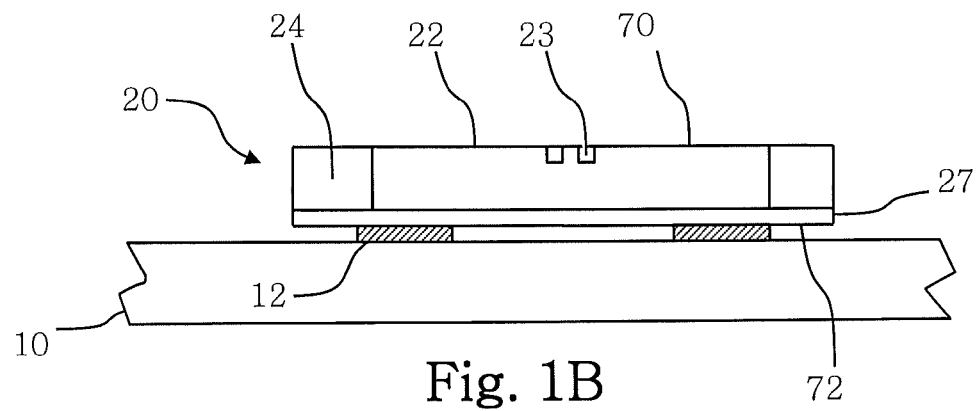
FIG. 1B is a cross section illustrating an embodiment of the present invention having doped semiconductor layers.
Figure 1C:
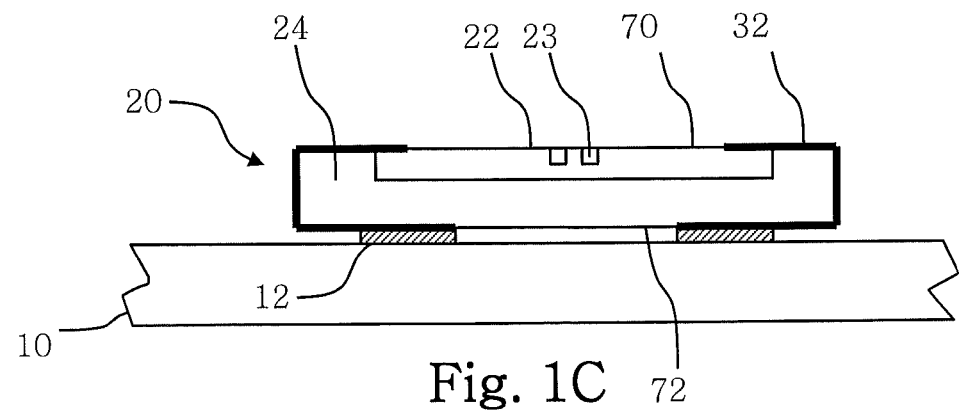
FIG. 1C is a cross section illustrating an embodiment of the present invention having a metal conductor.
Figure 7:
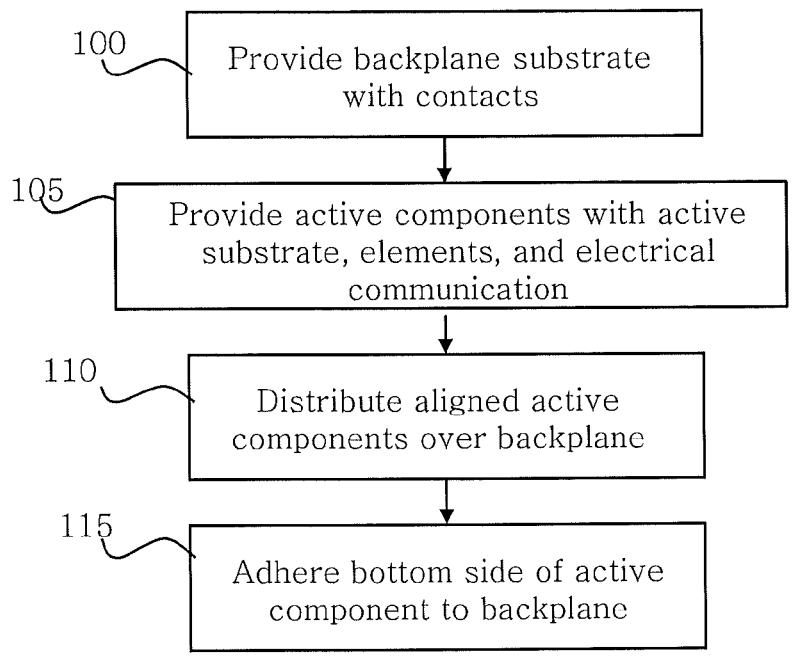
FIG. 7 is a flow diagram illustrating an embodiment of the method of the present invention.

Referring to FIGS. 1A-1C and to FIG. 7, an active component array comprises a target substrate 10 having one or more contact pads or contacts 12 formed on a side of the target substrate 10 and provided in step 100. One or more active components 20 are provided in step 105 and distributed over the target substrate 10 in step 110, each active component 20 including an active layer 24 having a top side 70 and an opposing bottom side 72 and one or more active element(s) 22 formed on or in the top side 70 of the active layer 24. The active element(s) 22 are electrically connected to the contact(s) 12, and the bottom side 72 is adhered to the target substrate 10 in step 115.

As used herein, an active component array (also referred to herein as an active component) is any substrate having active components located thereon. The active components can include electronic circuits, computing circuits, or optical elements that either emit or absorb light. The circuits can be either analog or digital, and can include transistors, capacitors, resistors, or other electronic elements. The active component array can include heterogeneous components distributed over the target, either regularly or irregularly. Substrates can be glass, polymer, metal, or semiconductor, for example silicon, GaAs, or other materials.

Referring to FIG. 1A, in one embodiment of the active component array of the present invention, one or more via(s) 30 are formed through the active layer 24 and are located over, and aligned with, at least one contact 12. The bottom side 72 is adhered to the target substrate 10. The active elements 22 can include electronic circuitry, for example transistors 23. A metal layer 32 is formed on at least a portion of the via 30 extending over at least a portion of the top side 70 of the active component 20, the metal layer 32 being in electrical contact with at least one active element 22 and at least one contact 12. In this way, the active elements 22 can electrically communicate through the metal layer 32 in the via 30 through the contact 12 to interact with other elements located on, or electrically connected to, the target substrate 10, for example external controllers (not shown) controlling the distributed active components 20.

Figure 2:
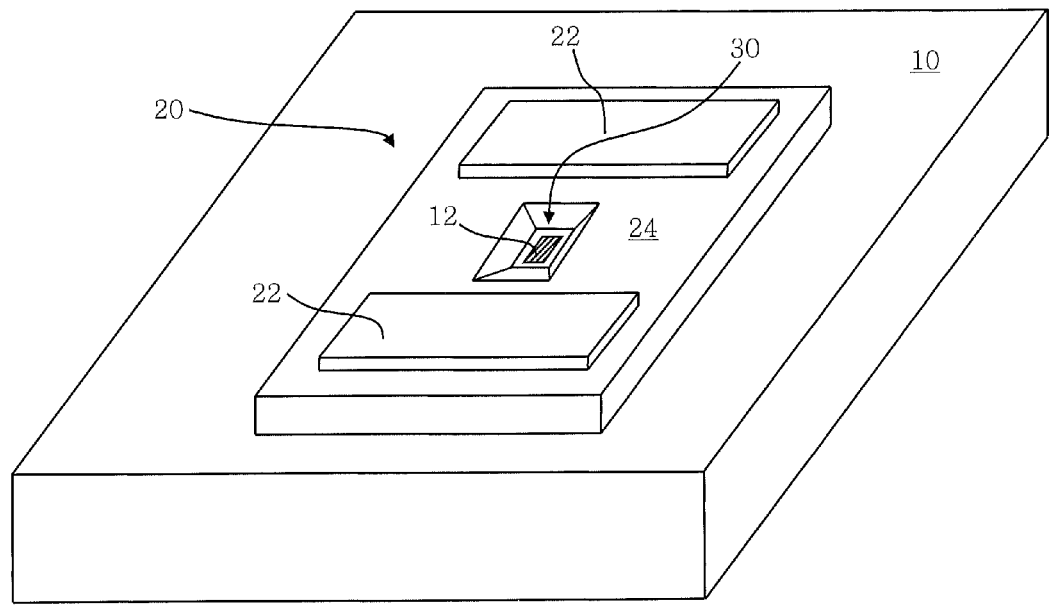
FIG. 2 is a perspective of the device elements illustrated in the cross section of FIG. 1A.

Referring to FIG. 2, a perspective view of an active component 20 with active elements 22 and a via 30 passing through the active component 20 from the top side of the active layer 24 to the bottom side is shown in alignment with a contact 12 formed on a target substrate 10.

Figure 3:
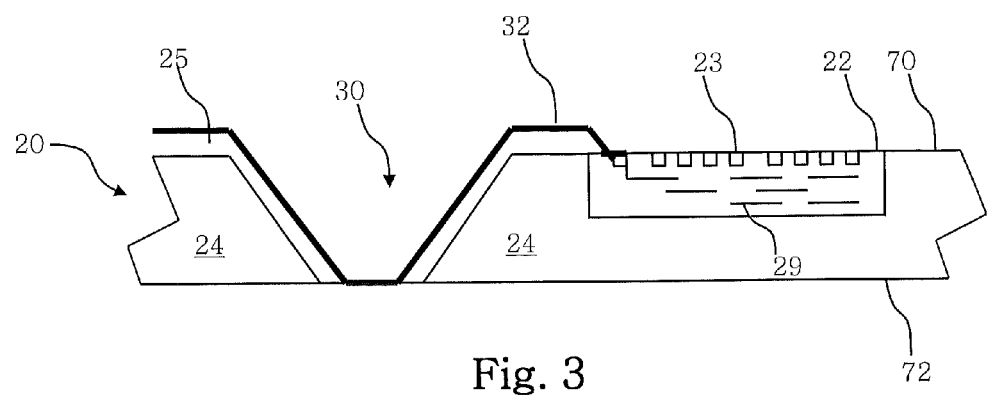
FIG. 3 is a cross section illustrating the use of an insulating layer on a semiconductor according to an embodiment of the present invention.

Referring to FIG. 3, an insulating layer 25, for example an oxide layer or dielectric layer, can be used to insulate any metal layers (e.g. 32) from the underlying active layer 24. Because, in some embodiments of the present invention, the active layer 24 is a semiconductor (e.g. crystalline silicon), it is helpful to insulate the semiconductor from current-carrying wires to reduce and/or present undesirable electrical responses in the materials. This insulating layer 25 is not shown in the remaining figures (except FIG. 16), but is understood to be useful in any embodiments that use a metal current carrying wires. In another embodiment of the present invention, the layer 25 can comprise a semiconductor layer doped with a charge opposite the doped charge of the underlying active layer 24 to provide at least a partial electrical insulation when a negative voltage bias is maintained between the p and n doped semiconductor layers.

Figure 14:
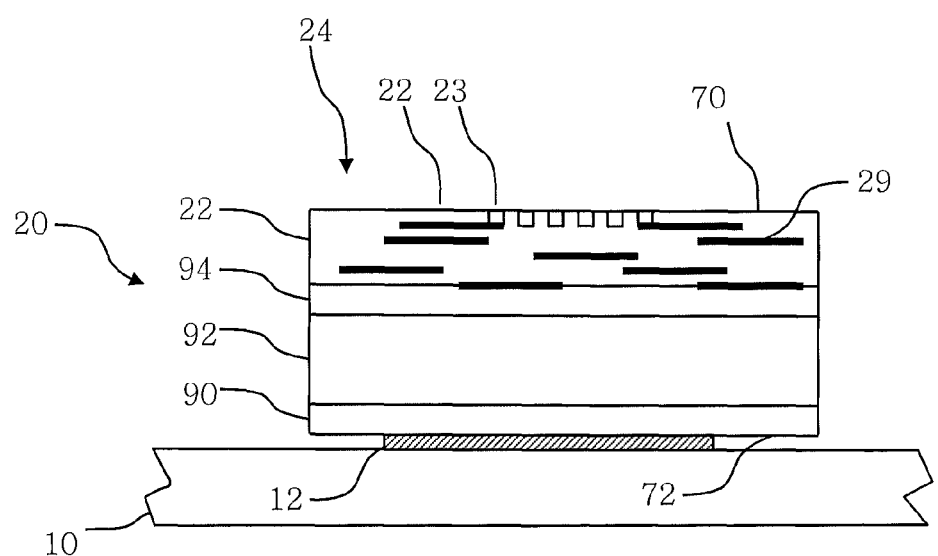
FIG. 14 is a cross section illustrating doped semiconductor layers according to an embodiment of the present invention.

Referring back to FIG. 1B and to FIG. 14, in another embodiment of the active component array of the present invention, the active layer 24 further comprises a first doped semiconductor layer 90 formed on the bottom side 72 of the active component 20, a semiconductor layer 92 formed between the first doped semiconductor 90 and the top side 70, and a second doped semiconductor layer 94 formed between the semiconductor 92 and the top side 70, wherein the second doped semiconductor layer 94 is doped with a charge opposite the doped charge of the first doped semiconductor layer 90. The semiconductor layers 90, 92, 94 are in contact. For example, the semiconductor layer 92 can be crystalline silicon, the first doped semiconductor layer 90 can be crystalline silicon with a p++ doping and the second semiconductor layer 94 can be crystalline silicon with an n++ doping. This stacked structure can be formed using, for example, well-established implantation, epitaxial growth, or wafer-bonding processes, or a combination of such processes, known in the art. The three layers then form a diode 27 through which current can pass from an active element 22 on the top side 70 of the active layer 24 to the bottom side 72 and thence to the contact 12. In an alternate embodiment of the present invention, the semiconductor layers 90, 94, can be doped in reverse to promote current flow in the other direction. The flow of current to and from the active elements 22 and the contacts 12 are facilitated by interconnections 29 within the active layer 24 that can be used as electrical connections between the active elements 22 and between the active elements 22 and the contacts 12. Means for constructing active elements in a crystalline semiconductor, electrical connections (e.g. metal wire layers), and doping crystalline layers are known in the integrated circuit photolithographic art.

In yet another embodiment of the present invention illustrated in FIG. 1C, a metal layer 32 is formed on at least a portion of the top side 70 of the active component 20, the side of the active component 20, and the bottom side 72 of the active component 20, the metal layer 32 being in electrical communication with at least one active element 22 and with at least one contact 12.

As described herein, the active elements formed on or in the top side of the active layer are, on average, closer to the top side than the bottom side. The active elements can extend into the active layer close to the bottom side of the active layer. The active layer can be a semiconductor layer, for example a crystalline semiconductor such as crystalline silicon. Portions of the active elements can be formed on top of the active layer and can be formed in layers within the active layer, for example by using photolithographic processes known in the integrated circuit art. In general, as described herein, the top side of the active layer is the process side of the active layer 24 for photo-lithographic processes. Note, however, that layers (e.g. metal layers or wires) can be formed on the bottom side of the active layer over other layers as are described below. The active layer 24 is then deposited and formed over the metal layers or wires.

In various embodiments of the present invention, the active component array of the present invention can be used, for example, to form an active-matrix where the active components are organized into an array controlling a corresponding array of elements, for example pixels in a display or a digital radiographic plate. In another example, the active components can be light-emitters, for example light-emitting diodes or LEDs, or a vertical cavity side-emission laser (e.g. edge laser). In yet another example, the active components can serve to convert incident light into electricity, forming a photovoltaic device, for example with photo-diodes. In cases where it is desirable to collect or emit light efficiently, the contacts or any metal layers formed beneath the active layer can reflect incident light that passes through the active component back through the active component. In the case in which an active component serves to convert light to electrical current, this reflection provides an improved absorption of light by the active component. In the case in which the active component emits light, or controls the emission of light by other layers, the reflection provides improved emission of light.

Figure 4A:
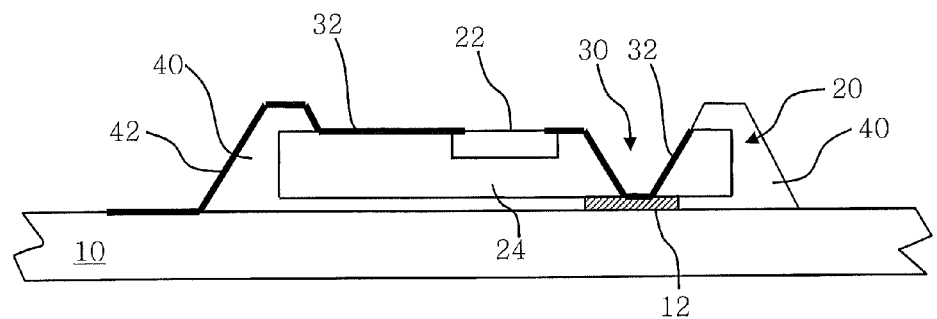
FIGS. 4A and 4B are cross sections including a patterned layer illustrating another embodiment of the present invention.
Figure 4B:
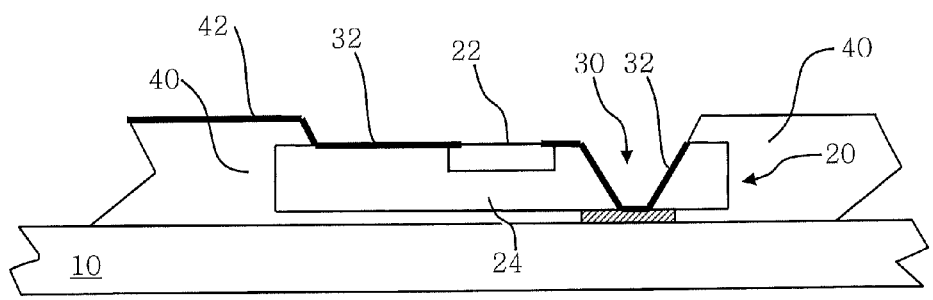
Figure 5:
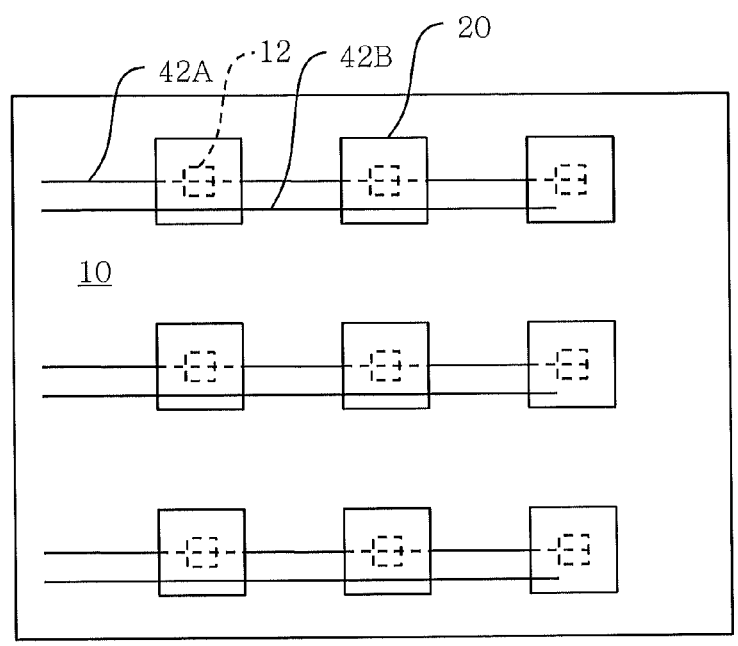
FIG. 5 is a top view illustrating the structure of FIGS. 4A and 4B.

Referring further to FIGS. 4A and 4B, a patterned layer 42 can be formed over an adhesive layer 40, for example an adhesive resin that can cover a portion of the active component 20. The patterned layer 42 can also extend over at least a portion of the active component 20 and over at least a portion of the target substrate 10 separate from the active component 20, and can be in electrical communication with the active element 22, providing an alternative means of electrically communicating with the active elements 22. The adhesive layer 40 can cover only a relatively small portion of the target substrate 10 so that the patterned layer 42 is formed largely on the target substrate 10 (as shown in FIG. 4A) or the adhesive layer 40 can extend over much of the target substrate 10 so that the patterned layer 42 is formed largely on the adhesive layer 40 (as shown in FIG. 4B). The patterned layer 42 can be in electrical contact with the metal layer 32 or contact 12 (not shown). In some embodiments of the present invention, the patterned layer 42 forms conductive traces that are in electrical contact with an active element 22. The conductive traces can be metal lines formed using photolithographic methods, and can communicate electrical signals to and from the active elements 22. FIG. 5 is a top view of a target substrate 10 having an array of active components 20 electrically connected with conductive traces. Conductive trace 42A is electrically connected to contacts 12 and then to active elements (not shown) while conductive trace 42B is electrically connected over the top side of the active components 20 to active elements (not shown).

In one embodiment of the present invention, a metal layer 32 (for example as illustrated in FIGS. 1A, 1B, and 1C) can be in direct electrical connection with a contact 12. If appropriate materials (e.g. a metal such as gold) are employed for the metal layer and the contact, the metals can weld when placed in direct contact, especially when placed in direct contact under pressure or heat. The welding effect can be enhanced with the application of heat or radiation, for example by using a laser to irradiate the contact 12. Thus a strong electrical and mechanical bond can be formed between the contact 12 and a metal layer 32 on the bottom side of the active layer 24.

Figure 6A:
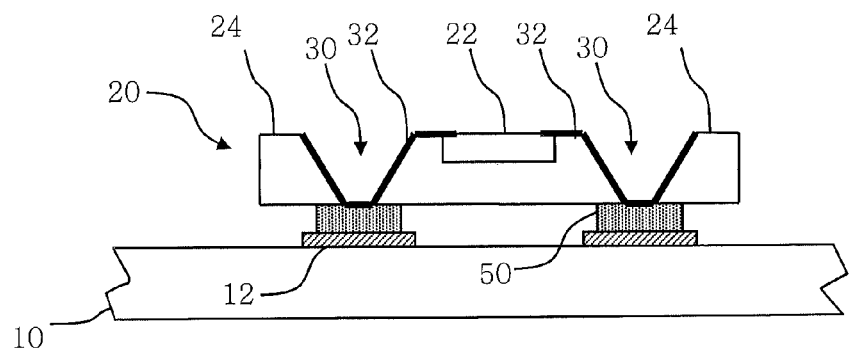
FIG. 6A is a cross section including a patterned electrically conductive material according to an embodiment of the present invention.
Figure 10:
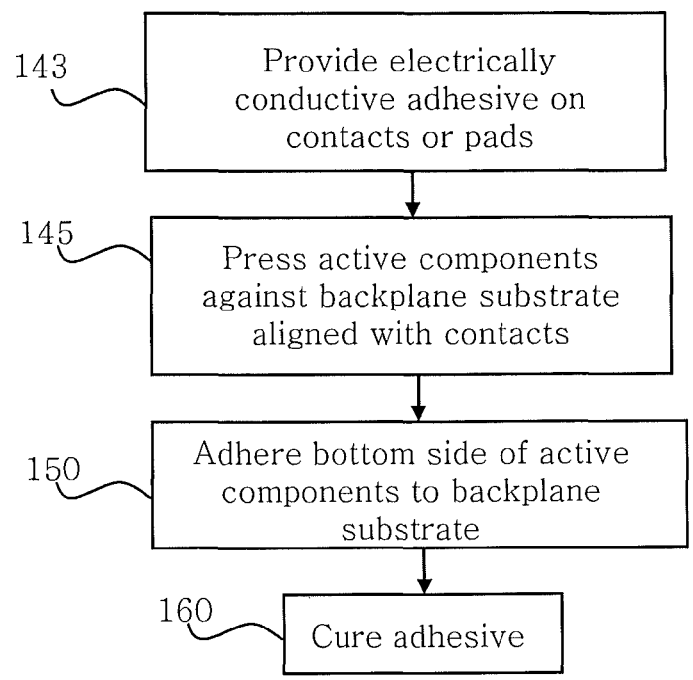
FIG. 10 is a flow diagram illustrating the use of an electrically conductive adhesive in an alternative embodiment of the method of the present invention.

According to an alternative embodiment of the present invention, electrical communication between an active element and the contact on the target substrate can be enhanced by improving the electrical connection between the metal layers and the contacts by providing an electrically conductive material between each metal layer and contact. Referring to FIG. 6A, an active component 20 has an active layer 24 with a via 30 formed through the active layer 24 coated with a metal layer 32. The metal layer 32 is formed over the via and a portion of the metal layer 32 electrically connects to an active element 22. The metal layers 32 and via 30 are aligned with the contacts 12. Referring also to FIG. 10, an electrically conductive material 50 is located in step 143 between the metal layer 32 and the contact 12. The electrically conductive material 50 can be an adhesive for example, coated on the target substrate 10 or on the active components 20. The active components 20 are then pressed in alignment with the contacts 12 against the target substrate in step 145. The active components 20 are adhered to the target substrate 10 with the electrically conductive adhesive material 50 in step 150 and the material 50 is cured in step 160, forming an electrical connection between the metal layer 32 and the contact 12. The electrically conductive adhesive material 50 can permanently adhere the active component 20 to the target substrate 10 after the electrically conductive adhesive material 50 is cured. The electrically conductive adhesive material 50 can be a curable material that is not electrically conductive when applied to the target substrate 10 or the metal layers 32 but is subsequently cured and thereby becomes electrically conductive. The electrically conductive material 50 can be a eutectic material, for example a solder.

Figure 6B:
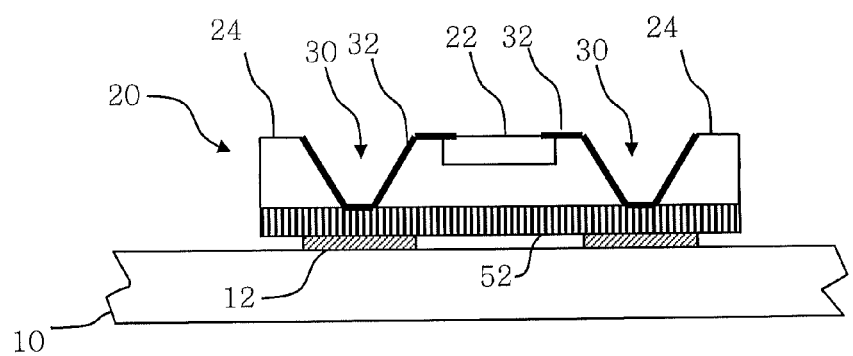
FIG. 6B is a cross section including an unpatterned electrically conductive material according to another embodiment of the present invention.
Figure 6C:
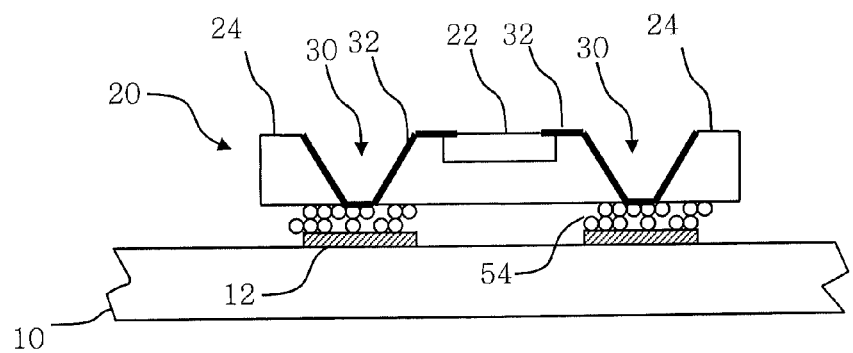
FIG. 6C is a cross section including patterned sintered nano-particles according to another embodiment of the present invention.

Alternatively, as illustrated in FIG. 6B, the electrically conductive material 50 can be an anisotropic conductive film. In another embodiment (FIG. 6C), the electrically conductive material 50 comprises sintered metal nano-particles. In some embodiments, the electrically conductive material 50 can be patterned and located, for example only on the contacts or metal layers (as shown in FIG. 6A). Such an arrangement can be useful, for example with solders or conductive inks, to prevent electrical shorts between separate contacts. In other embodiments, shown in FIG. 6B, the electrically conductive material 50 is unpatterned and located, for example everywhere under an active component. By unpatterned is meant that the electrically conductive material 50 is not patterned in the area between the active component 20 and the target substrate 10. Such an arrangement can be used, for example with anisotropic conductive films that, when cured (e.g. by pressure), may prevent electrical shorts between separate contacts by only conducting electrical current through the film between the contacts 12 and the metal layer 32.

Figure 6D:
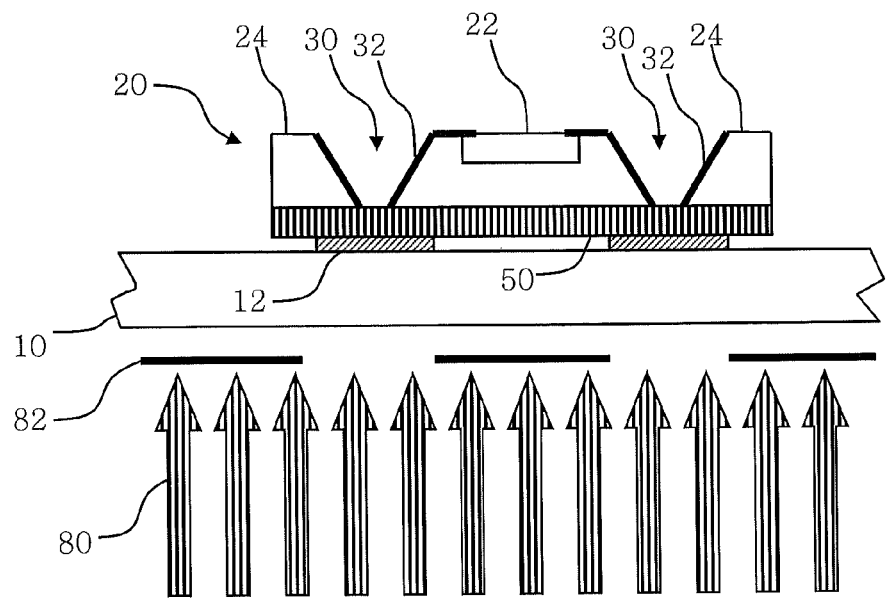
FIG. 6D is a cross section illustrating the exposure of an unpatterned electrically conductive material through a mask according to an embodiment of the present invention.
Figure 6E:
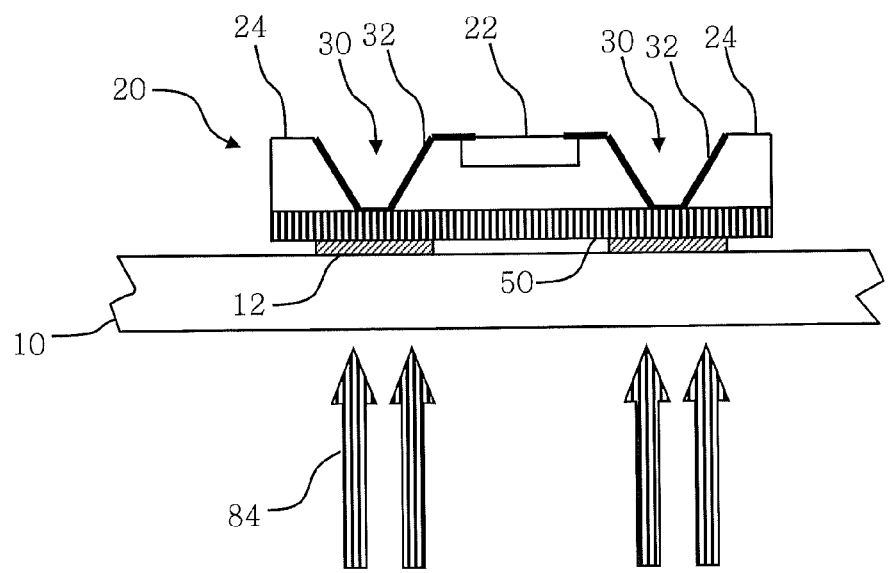
FIG. 6E is a cross section illustrating the patterned exposure of an unpatterned electrically conductive material according to an embodiment of the present invention.
Figure 6F:
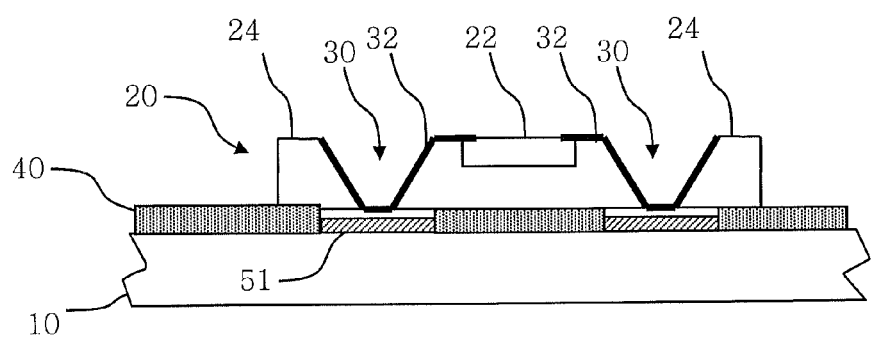
FIG. 6F is a cross section that illustrates an embodiment of the present invention including a eutectic material before reflowing.
Figure 6G:
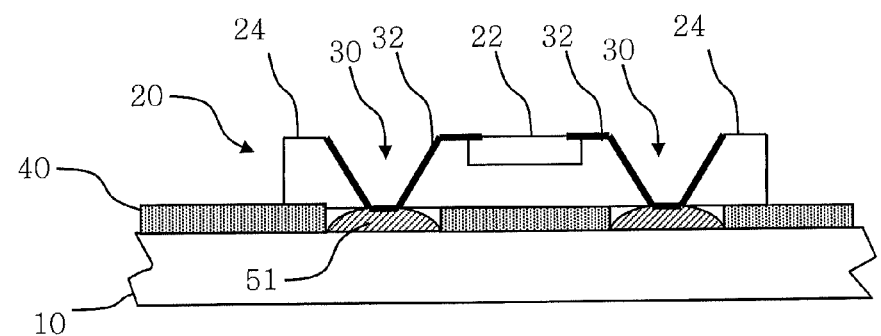
FIG. 6G is a cross section that illustrates an embodiment of the present invention including a eutectic material after reflowing.

Alternatively, as illustrated in FIG. 6F, the active components 20 are adhered to the target substrate 10 using a patterned adhesive layer 40. The patterned electrically conductive contact can be a eutectic material 51 or have a eutectic material coating (e.g. contact 12, not shown separately from the eutectic material 51), for example solder, with a thickness less than or equal to the thickness of the patterned adhesive layer 40. Thermal and electrical contacts between the eutectic material 51 and the metal layers 32 can be established by reflowing the eutectic material 51 as illustrated in FIG. 6G. Referring to FIG. 6G, the eutectic material 51 has been reflowed to form a curved surface that contacts the metal layers 32 to establish electrical communication with the metal layer 32. Reflow soldering is a process known in the prior art in which a solder paste (a sticky mixture of powdered solder and flux) is used to temporarily attach one or several electrical components to their contact pads, after which the entire assembly is subjected to controlled heat, which melts the solder, permanently connecting the joint. In a further embodiment of the present invention, a eutectic layer can be incorporated on the metal layer 32 to establish electrical communication between the metal layer 32 and an underlying contact.

A variety of means can be employed to cure the electrically conductive material 50. For example, referring to FIG. 6D, a source of electromagnetic radiation can emit unpatterned electromagnetic radiation 80 (for example light, ultraviolet radiation, or infrared radiation) through a mask 82 that patterns the exposure of electromagnetic radiation onto the target substrate 10. Referring to FIG. 6E, in an alternative method, a light source 84 that exposes a limited area, for example a laser, can directly expose a desired area, such as the contact to heat the limited area or expose it to radiation that cures the electrically conductive material 50 without the need for a mask. Additional, light-absorbing materials can be integrated into the contacts 12 or electrically conductive material 50 to increase the amount of heat or radiation absorbed. Electromagnetic radiation can also be directed through the via 30 and metal layer 32 to heat or expose the electrically conductive material 50.

The electrically conductive material can comprise a variety of materials. In particular, eutectic materials combining multiple different metals can be used, for example mixtures of tin and lead, mixtures of indium, gold, and copper, mixtures of gallium and indium, or mixtures of tin, silver, and copper. The electrically conductive materials can be patterned through screen printing or other patterning methods including photolithographic methods or micro-dispensing methods. In one embodiment of the present invention, nano-metals, for example nano-meter-sized metal particles of, for example, noble metals, silver, or gold, can be dispensed in a liquid carrier through, for example, an inkjet or other micro-dispensing patterned-application device. These materials can be cured by heat, supplied, for example by baking or through the patterned application of energy, for example a laser through the target substrate or through the active component to form an electrically conductive sintered particulate conductor. In another embodiment of the present invention, an oxide layer can be formed on a metal contact. Once the metal layer is aligned and adjacent to the metal contact, the patterned application of energy to the metal contact can drive metal through the oxide layer to form an electrical connection between the metal layer and the metal contact. As noted above, the metal layer and the contact can be welded.

Figure 8A:
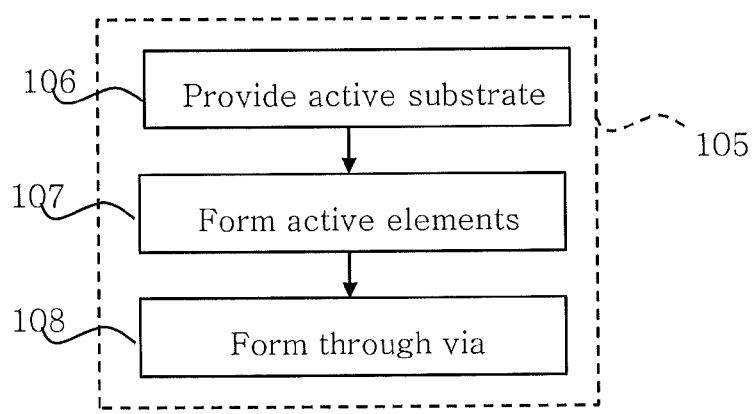
FIGS. 8A-8E are flow diagrams illustrating portions of various methods of the present invention.

The steps of forming the various elements of the present invention can be performed in different orders, depending on the needs of the manufacturing process and various embodiments of the present invention. Referring to FIG. 8A, the step 105 of providing the active components can further include the steps of providing an active substrate in step 106, forming active elements 22 on the active substrate 28, for example by employing photolithographic processes known in the art, in step 107. A via through the active substrate is formed in step 108 to complete the active component.

Figure 8B:
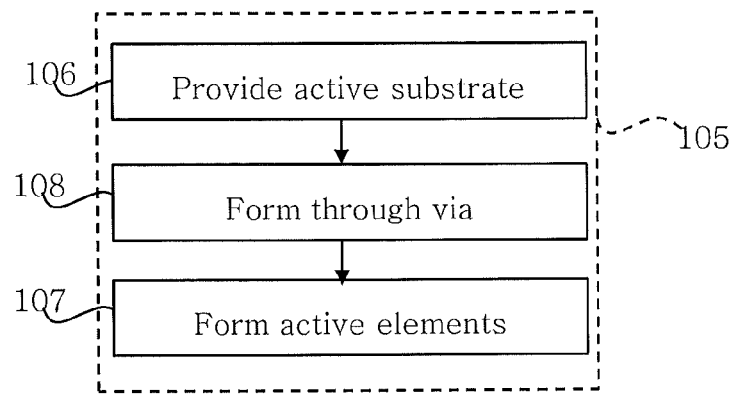

In an alternative embodiment of the present invention, referring to FIG. 8B, the via can be formed before the active elements. For example, step 105 of providing the active components can further include the steps of providing an active substrate in step 106, forming a via through the active substrate in step 108, and forming active elements on the active substrate, for example by employing known photolithographic processes in step 107.

Figure 8C:
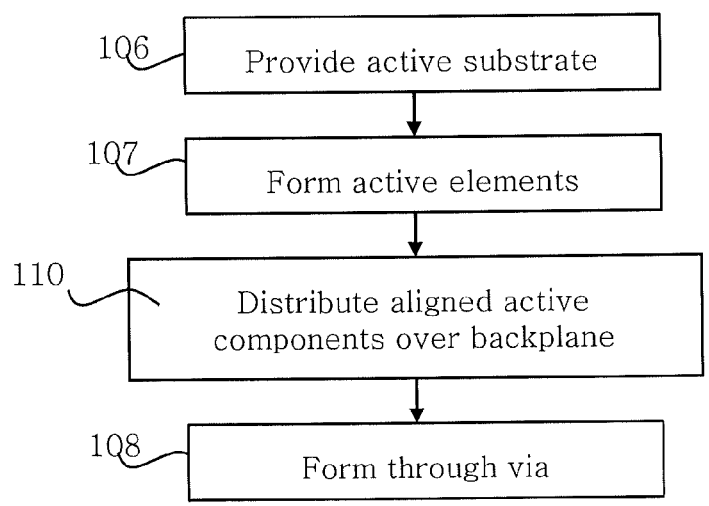

In yet another alternative embodiment of the present invention, referring to FIG. 8C, the via can be formed after the active components are distributed over the target substrate. For example, an active substrate can be provided in step 106, the active elements formed in step 107, the active components distributed over the target substrate in step 110, and a via formed through the active substrate in step 108.

Figure 8D:
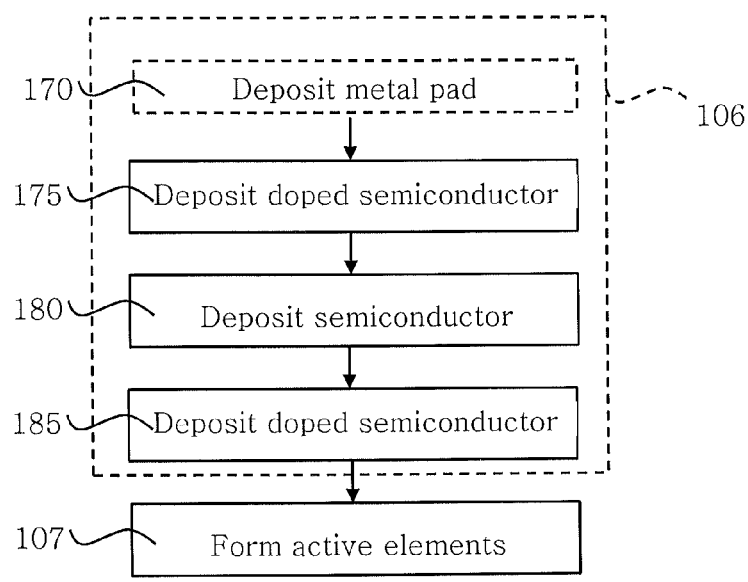

In yet another method of the present invention illustrated in FIG. 8D, the step 106 of providing an active substrate further comprises the optional step of depositing a metal layer as a conductive pad in optional step 170 followed by the step of forming a first doped semiconductor layer on the bottom side of the active component in step 175. In step 180, a semiconductor layer is formed followed by forming a second doped semiconductor layer in step 185, wherein the second doped semiconductor layer is doped with a charge opposite the doped charge of the first doped semiconductor layer. The remainder of the active layer and the active elements can be formed over the second doped semiconductor layer and can include metal interconnects, doped elements, and the like to form an integrated circuit, using known methods.

Figure 8E:
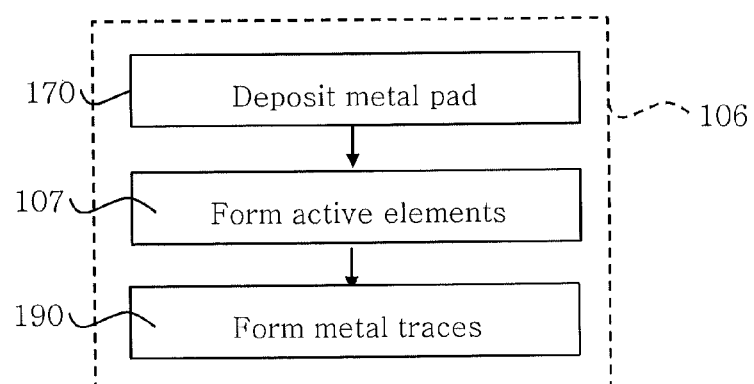

In another method of the present invention, illustrated in FIG. 8E, a metal pad is formed in step 170, followed by the formation of the active layer and active elements in the active layer. Metal traces are then formed in step 190 to electrically connect the active elements to the metal pad. This can be done after the location of the active components over the contacts so that the contacts are located in alignment and in electrical communication with the metal pad.

Figure 9:
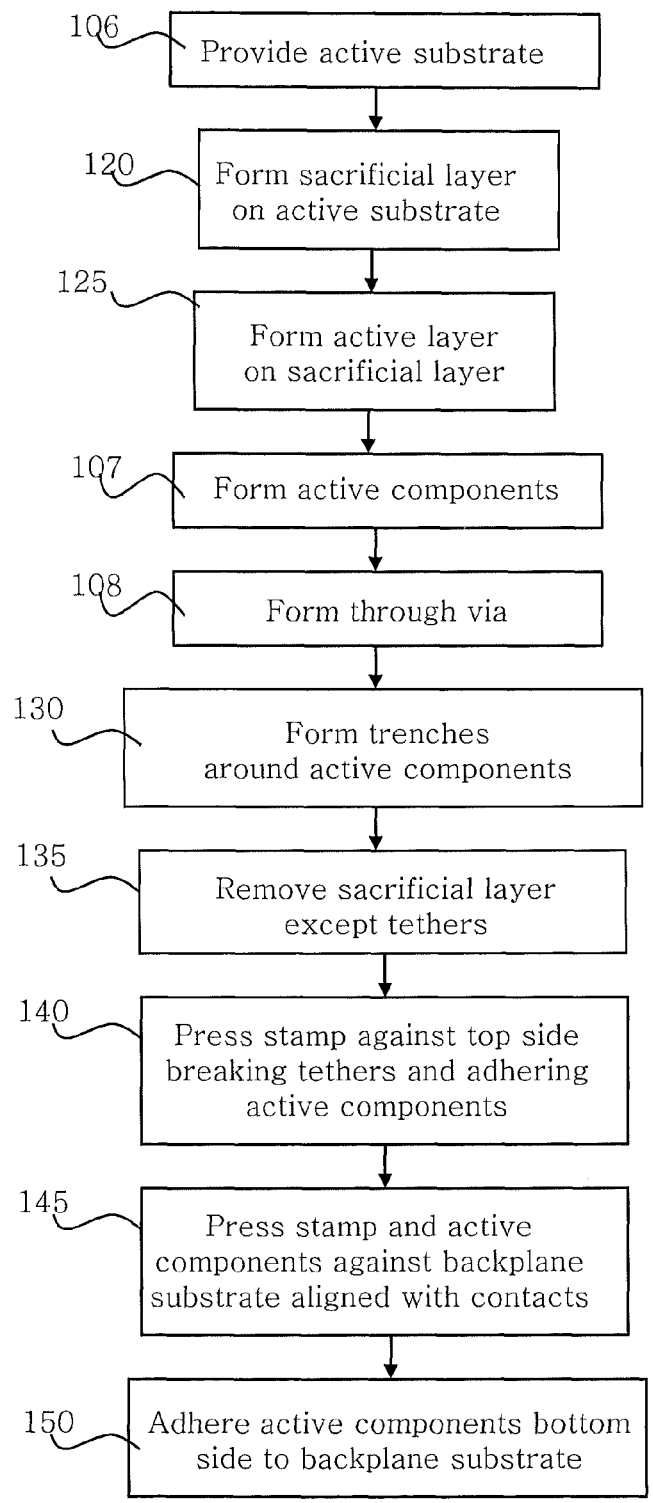
FIG. 9 is a flow diagram illustrating an alternative embodiment of the method of the present invention.
Figure 11A:
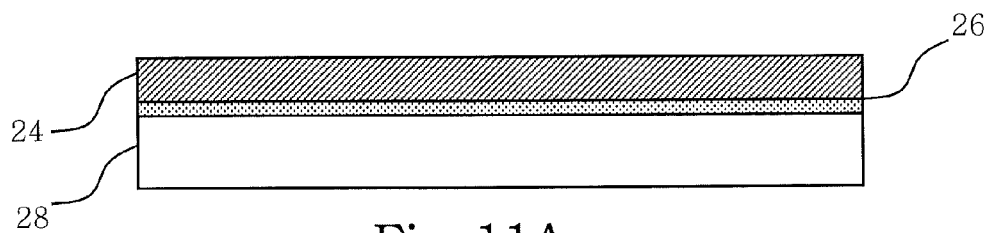
FIGS. 11A-11G are cross sections of the elements of active components at different stages of construction according to an embodiment of the method of the present invention.

Referring to FIG. 9 and to FIGS. 11A-11G, a printing process using a stamp to transfer active components from a wafer to a target substrate can be employed in some embodiments of the present invention. Referring to FIGS. 9 and 11A, an active substrate 28 is provided in step 106 and a sacrificial layer 26 formed on the active substrate in step 120. An active layer 24 is then formed on the sacrificial layer 26 in step 125. The active substrate 28 can be a semiconductor, for example crystalline silicon, the sacrificial layer 26 can include an oxide layer, and the active layer 24 can be a semiconductor, for example crystalline silicon. These materials and layers can be deposited and processed using known photolithographic methods.

After the sacrificial layer and the active layer are deposited on the active substrate, the active substrate can be processed to form active components in or on the active layer, for example using silicon foundry fabrication processes. Additional layers of material can be added as well as other materials such as metals, oxides, nitrides and other materials known in the integrated-circuit art. Each active component can be a complete semiconductor integrated circuit and includes, for example, transistors. The active components can have different sizes, for example, 1000 square microns or 10,000 square microns, 100,000 square microns, or 1 square mm, or larger, and can have variable aspect ratios, for example 2:1, 5:1, or 10:1. The active components can have a thickness of 5-20 microns, 20-50 microns, or 50-100 microns. Substrates of this size cannot typically be handled using traditional techniques, for example surface mounting techniques.

Figure 11B:
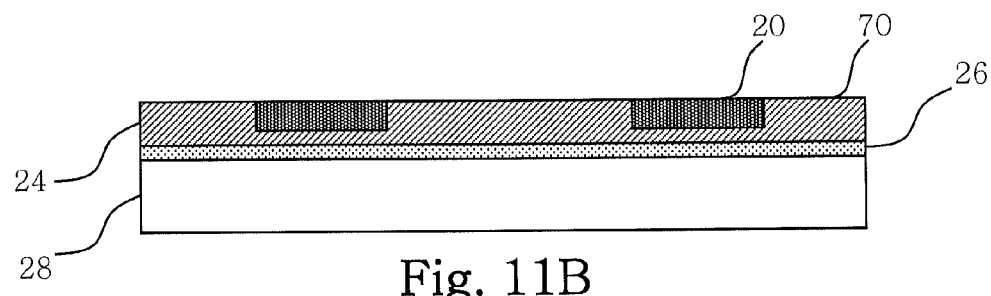
Figure 11C:
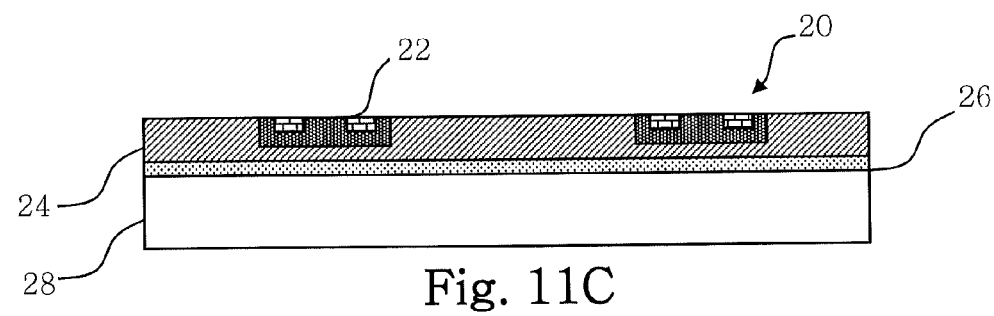
Figure 11D:
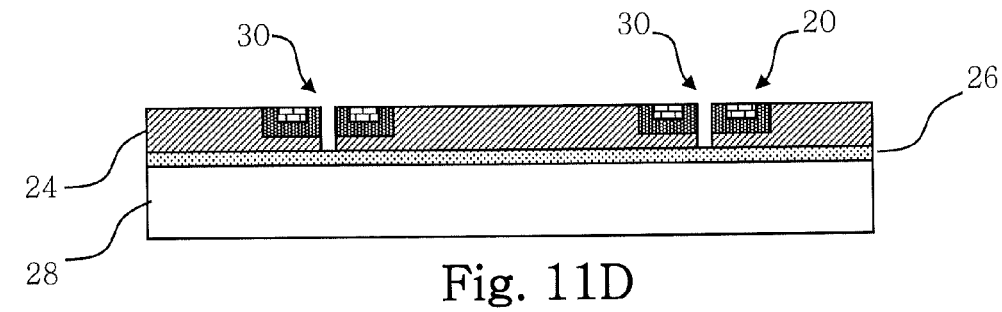
Figure 11E:
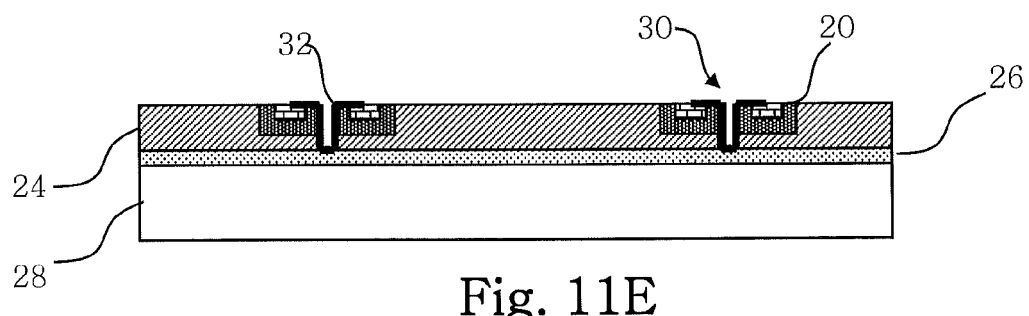
Figure 11F:
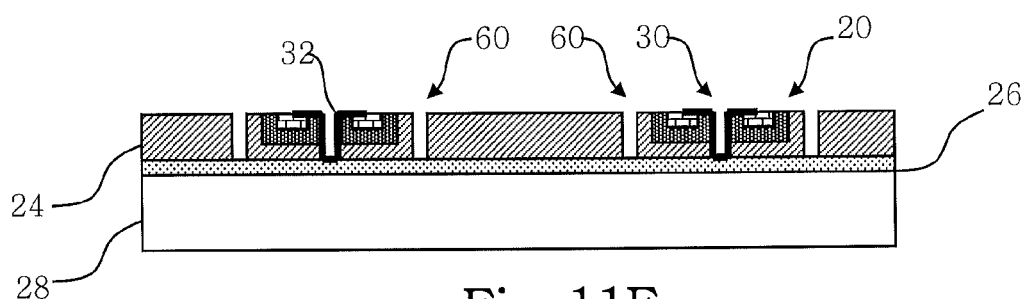
Figure 12:
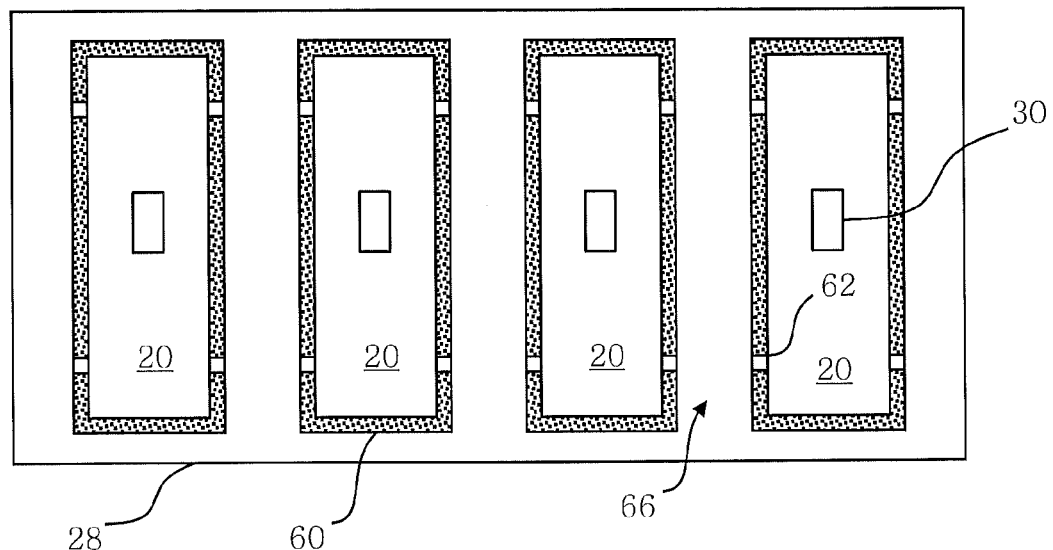
FIG. 12 is a top view illustrating the structure of FIG. 11G.

Referring to FIG. 11B, active components 20 are formed on or in the top side of the active layer in step 107, for example, using traditional methods to manufacture integrated circuits and known in the photolithographic arts. Active elements 22 (FIG. 11C) can be formed in the active components 20. The active elements can be electronic circuits. As shown in FIG. 11D, a via 30 is formed through the active component 20 and active layer 24 in step 108. Once the vias 30 are formed and coated with a metal layer 32, a trench 60 is formed around the active components 20 (FIG. 11E) in step 130, except for breakable tethers 62 connecting the active components 20 to an anchor area 66 (shown in the top view of FIG. 12) of the active layer 24. The trenches structurally isolate the active components from each other and the remainder of the active layer. The trench extends through the active layer to the sacrificial layer. The trenches can be formed before the active components are processed, or can be formed as a part of the active component formation process.

Figure 11G:
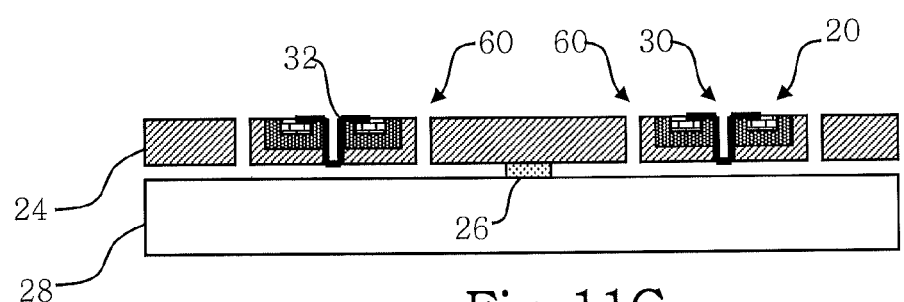

In an alternative embodiment, the vias can be formed in the same step as the trenches and the metal layers coated subsequently. The sacrificial layer 26 except for the tethers 62 is removed in step 135, so that the active components 20 are released from the active substrate 28, except for the connecting tethers 62 to the anchor area 66 of the active layer 24 (FIG. 11G).

In another embodiment of the present invention, the vias can be completely filled with metal to provide additional conductivity and mechanical and environmental robustness. Alternatively, using the structure of FIG. 1B, step 125 of forming the active layer can include the steps of forming a sacrificial layer 26 on an active substrate 28, and then sequentially forming the doped and undoped semiconductor layers of FIG. 14, using semiconductor processing methods known in the art. If a metal layer is desired on the bottom of the active layer, it can first be formed over the sacrificial layer, for example, using semiconductor processing methods known in the art, and the subsequent active layers formed over the metal and sacrificial layers.

The sacrificial layer is 26 then removed, for example by etching with hydrofluoric acid to release the active components 20 from the active substrate 28. The active components 20 are completely detached from the active substrate 28, except for tethers 62 connecting the active components 20 to an anchor area 66 of the active layer 24 that remains attached to the active substrate 28 and sacrificial layer 26. The relative width of the space between the active components in the active layer and the relative size and aspect ratio of the active components are chosen together with the etch rate and conditions to properly separate the active components from the source substrate without removing the anchor areas. The tethers can be protected from the etch step by coating the tethers with an etch-resistant material or forming the tethers from different, etch-resistant materials (using photo-lithographic processes).

Figure 13A:
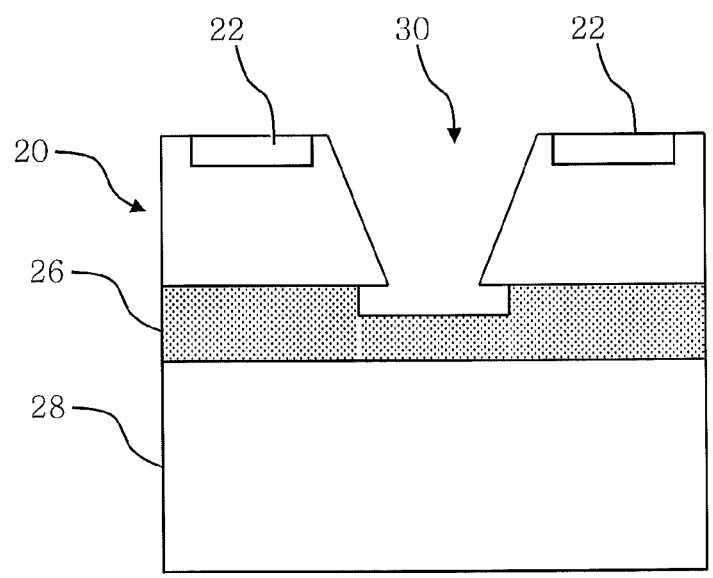
FIGS. 13A-13C are cross sections of the metal layer in a via at different stages of construction according to an embodiment of the method of the present invention.
Figure 13B:
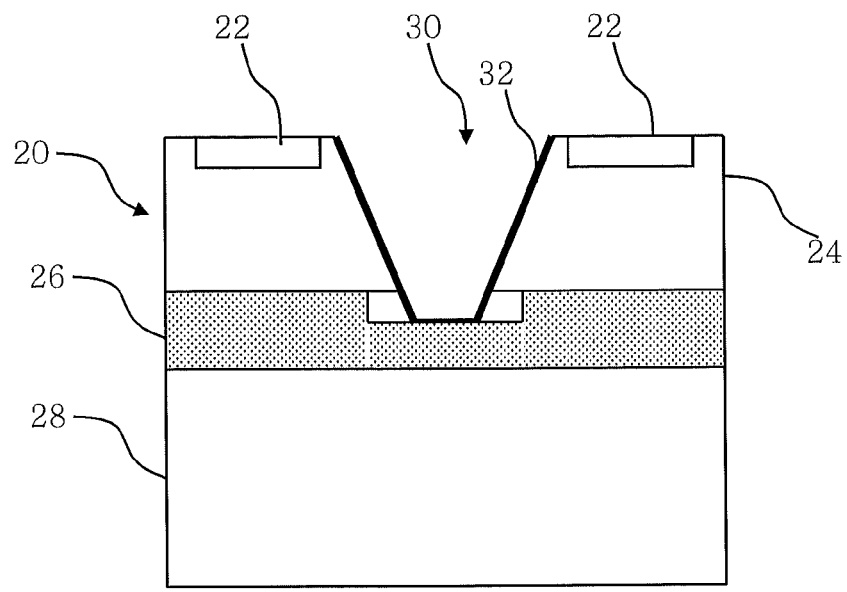
Figure 13C:
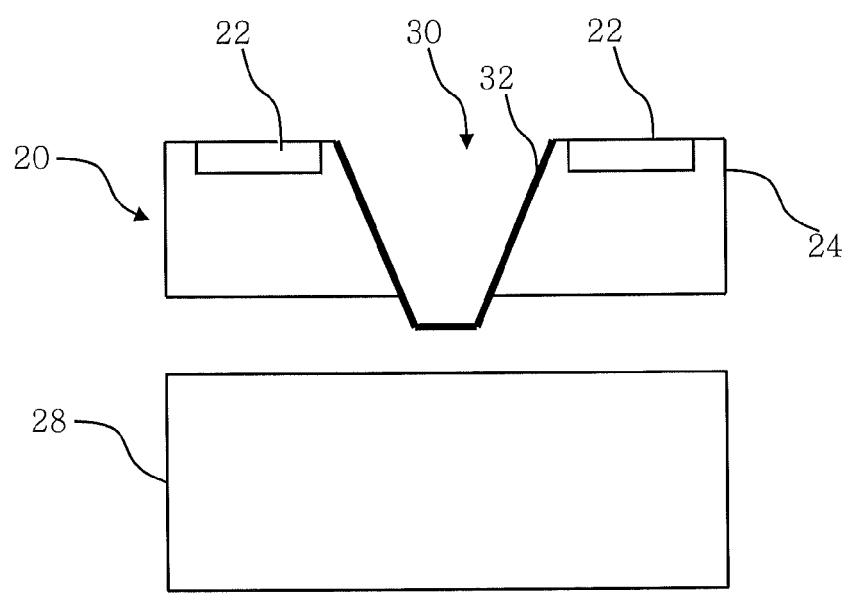

When employed within a via, the metal layer 32 can be formed to protrude or extend slightly beneath the lower surface of the active layer 24 as illustrated in FIGS. 13A-13C. Referring to FIG. 13A, an active component 20 formed over a sacrificial layer 26 and active substrate 28 has a via 30 located between two active elements 22. The etching process for the via 30 can undercut the sacrificial layer 26 at the sides of the via 30 and beneath the via 30. Referring to FIG. 13B, the metal layer 32 deposited in the via 30 then extends down to the remaining sacrificial layer 26 material below the active layer 24. The subsequent removal of the sacrificial layer 26, shown in FIG. 13C, leaves the metal layer extending slightly beneath the active layer 24. By extending the metal layer 32 beneath the active layer 24, the metal layer 32 has improved electrical communication with the contacts formed on the target substrate.

Referring back to FIG. 9, a stamp, for example made of PDMS and having protrusions matched to the location, size, and shape of each active component is provided and then pressed in alignment against the top side of the released active components to break the tethers and adhere the active components to the stamp protrusions in step 140. As such, some or all of the active components include at least one tab, where each tab includes a broken portion of the tether used to connect the active component to the anchor area of the active layer. The active components are then aligned with the target substrate and adhered to the target substrate by pressing the stamp including the active components against the target substrate in step 145. A curable electrically conductive adhesive can be located between the target substrate contacts and the metal layers in the vias of the active components to assist in adhering the active components to the target substrate. The curable electrically conductive adhesive can then be cured in step 150 to adhere the active components to the target substrate.

One method of curing the electrically conductive adhesive is to expose the adhesive in the desired locations between the metal layer and the contacts to patterned electromagnetic light provided, for example, by a laser (as shown in FIG. 6E). In one embodiment, the laser light is directed through the target substrate, in another embodiment the light is directed through the via and active layer. In a further embodiment, the laser light can be directed through the stamp.

In various embodiments of the present invention, the via can be formed before the one or more active components are distributed over the target substrate or after the one or more active components are distributed over the target substrate.

Some embodiments of the present invention provide a high-performance active substrate with a reduced number of layers and process steps and provides more robust electrical interconnections. In some embodiments of the present invention, the active components are small integrated circuits formed in a semiconductor wafer substrate, for example gallium arsenide or silicon, which can have a crystalline structure. Processing technologies for these materials typically employ high heat and reactive chemicals. However, by employing transfer technologies that do not stress the active component or substrate materials, more benign environmental conditions can be used compared to thin-film transistor manufacturing processes. Thus, the present invention has an advantage in that flexible substrates (e.g. polymer substrates) that are less tolerant of extreme processing conditions (e.g. heat, chemical, or mechanical processes) can be employed either for the active substrate or target substrate or both. Furthermore, it has been demonstrated that crystalline silicon substrates have strong mechanical properties and, in small sizes, can be relatively flexible and tolerant of mechanical stress, particularly for substrates of 5 micron, 10 micron, 20 micron, 50 micron, or even 100-micron thicknesses. Alternatively, the active layer can be a microcrystalline, polycrystalline, or amorphous semiconductor layer.

Once all of the active components to be used in a process are transferred, the active substrate can be stripped of the remaining active layer and sacrificial layer materials and cleaned. A second sacrificial layer can be formed over the active substrate and a second active layer formed over the second sacrificial layer. The process of constructing new active components can then be repeated, thereby reusing the active substrate.

In various methods of the present invention, laser beams are used to selectively cure the electrically conductive adhesive areas between the contacts and the metal layers. In one embodiment, the adhesive areas can be sequentially exposed. In another embodiment, multiple areas can be simultaneously exposed; thereby increasing the number of active components simultaneously adhered. An alternative method employing a mask can also adhere multiple active components at one time, thereby increasing the rate at which target substrates can be populated. Means known in the art for scanning and controlling lasers can be employed, as well as light sources used in conjunction with aligned masks, particularly as are known in the photo-lithographic arts.

In comparison to thin-film manufacturing methods, using densely populated active substrates and transferring active components to a target substrate that requires only a sparse array of active components located thereon does not waste or require active layer material on a target substrate. The present invention is also useful in transferring active components made with crystalline semiconductor materials that have much higher performance than thin-film active components. Furthermore, the flatness, smoothness, chemical stability, and heat stability requirements for a target substrate useful in the present invention are greatly reduced because the adhesion and transfer process is not significantly limited by the target substrate material properties. Manufacturing and material costs are reduced because of high utilization rates of expensive materials (e.g. the active substrate) and reduced material and processing requirements for the target substrate.

Figure 15:
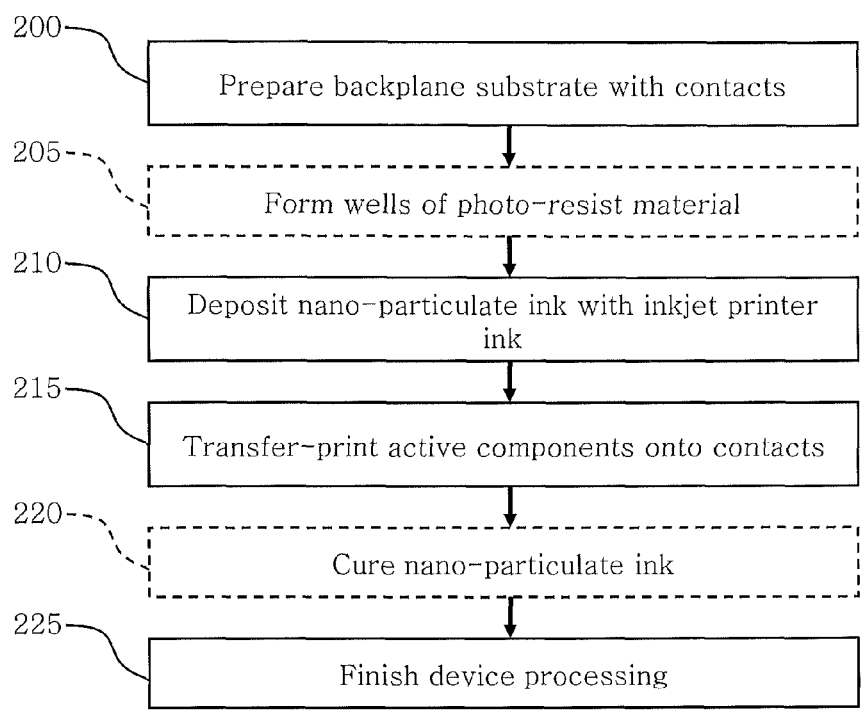
FIG. 15 is a flow diagram illustrating an experimental method according to an alternative embodiment of the method of the present invention.

In an experimental demonstration, the structure illustrated in FIG. 1C was constructed and adhered to a target substrate with an electrically conductive material. Referring to FIG. 15, a target substrate was prepared in step 200 by patterning suitable metal traces, metal contacts, and fiducial marks on the surface of the target substrate. Optional photo-resist wells were constructed in optional step 205 to contain a liquid carrier (ink) with metal nano-particles. The photo-resist wells served to form dams that prevent the liquid carrier ink from spreading over the target substrate in undesirable locations. In step 210, a nano-particulate ink including noble metal nano-particles (in this case Au nano-particles) and a soft conformable material carrier was dispensed by an inkjet printer onto the target substrate. The soft conformable material carrier "ink" was a polymer, useful for rheological control and particulate stabilization. In particular, it is useful to prevent nano-particulate agglomeration by emulsifying the ink or providing coatings on the nano-particles. Other carriers, e.g. solvents, and particle combinations can be employed by those knowledgeable in the art, and the present invention is not limited to this particular example.

Having prepared the target substrate, active components were prepared by forming an active layer over a sacrificial layer on an active crystalline GaAs substrate. The active components were released from the active substrate by etching away the sacrificial layer, except for tethers, as described above. A PDMS stamp was used to separate the active components from the active substrate, breaking the tethers, and the active components were printed onto the target substrate in alignment with the contacts and the dispensed ink in step 215. An optional curing step was employed to treat the ink and improve the electrical characteristics of the interface between the active component and the contact in step 220. A variety of cure methods can be used, for example baking or exposure to electromagnetic radiation, patterned or unpatterned, from a variety of sources, for example a laser. Solvents, if present, can be driven off from the ink and the nano-particles can be sintered or annealed in contact with the active component and the target substrate contact. For example, gold particles can be used to form a GaAs—Au eutectic material that can provide a good electrical connection with the target substrate. Once the active component was adhered and electrically connected to the target substrate, further target substrate processing was employed in step 225 to make a complete device, e.g. including fabrication of dielectric interconnection layers and film interconnect metallization.

Figure 16:
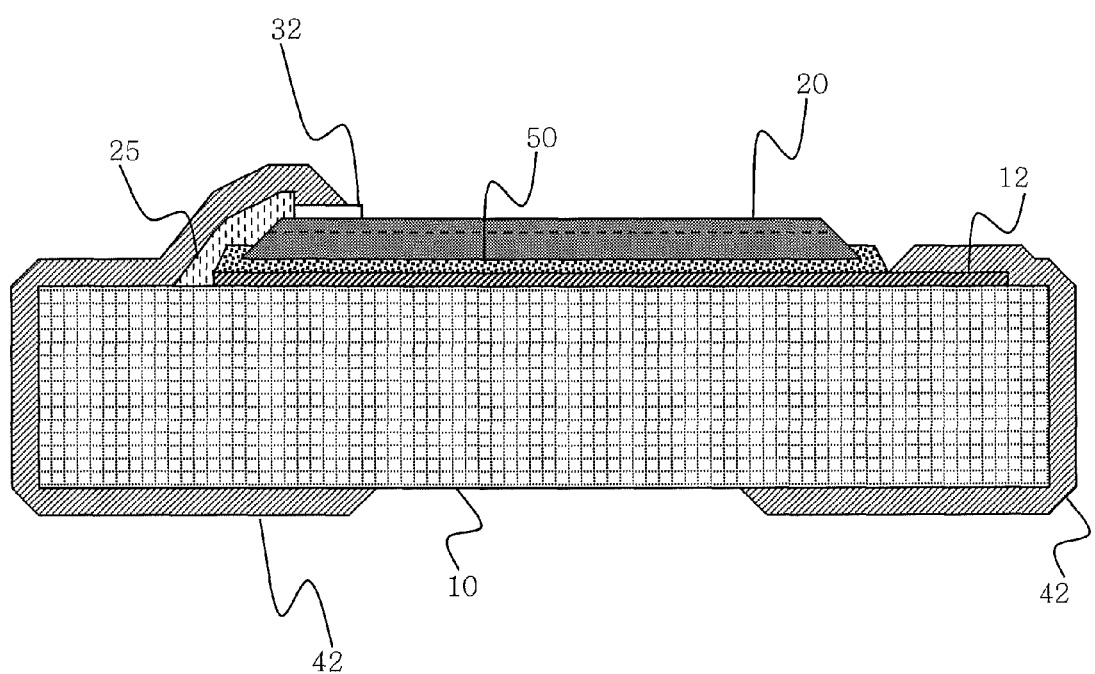
FIG. 16 is a cross section illustrating an experimental device made according to an embodiment of the present invention.

The completed experimental device is illustrated in FIG. 16. Referring to FIG. 16, the active component 20 is a printed opto-electronic device (for example a solar cell, photo-diode, LED, or VCSEL) with an electrical connection on the bottom side, as described above. The electrically conductive layer 50 was a colloidal, inkjettable ink containing noble metal particles forming an electrical connection between the metal contact 12 and the bottom side 72 of the active component 20. The target substrate 10 is a carrier chip or interposing substrate, for example a ceramic substrate, a printed-circuit board, or a wafer. The metal layer 32 is an ohmic metal contact to the active component semiconductor material and can include Au—Ge—Ni metals. A dielectric isolation layer 25 prevents unwanted electrical effects with the active substrate and also serves to further adhere the active component 20 to the target substrate (as does the adhesive 40 in FIG. 4A). Patterned layer 42 forms electrical interconnects between the metal layer 32 and the back side of the target substrate 10 and electrical interconnects between the contact 12 and the back side of the target substrate 10. The patterned layer can comprise, for example, plated Cu—Ni—Au and the two interconnects can form an anode and cathode for the active component 20.

Figure 17:
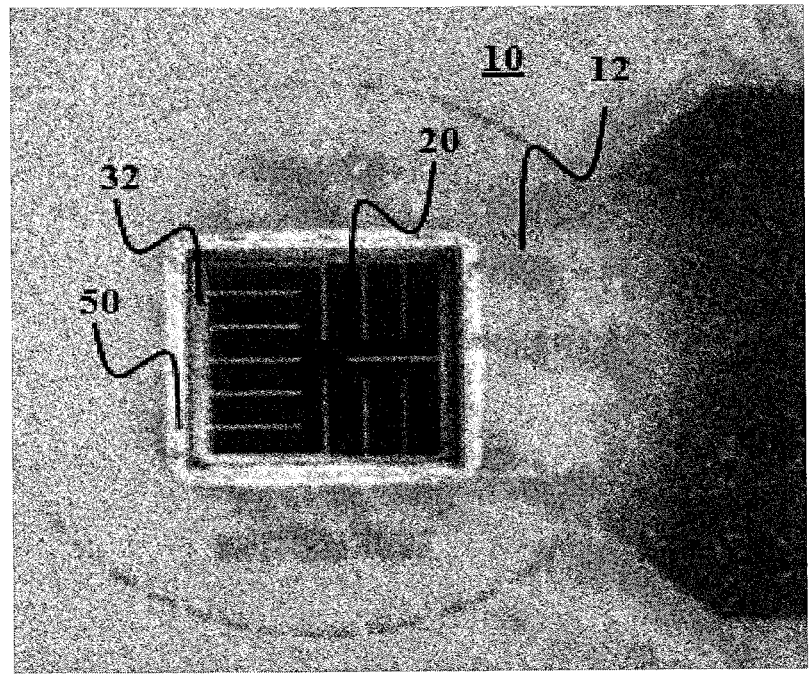
FIG. 17 is a photograph of an experimental device made according to an embodiment of the present invention.
Figure 18:
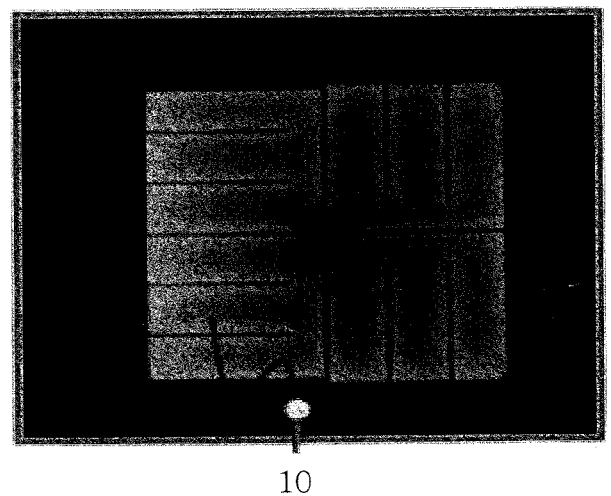
FIG. 18 is a photograph of the experimental device of FIG. 17 emitting light.

The entire package, including the target substrate 10, the active component 20, and the electrical interconnects 42 comprise a surface-mount package for an inorganic opto-electronic chip-level device. FIG. 17 is a photograph of the experimental device including a ceramic target substrate 10 with a metal contact 12 underlying an InGaP/GaAs solar cell/LED active component 20 with an inkjet-deposited and annealed Au nano-particle electrically conductive ink material 50 forming an electrical connection between the metal contact 12 and the active component 20. Metal layer 32 forms an ohmic contact with the active component 20 and serves as a probe point, that together with the metal contact 12 can be used to energize the active component 20. FIG. 18 is a photograph of the energized opto-electronic device emitting light.

The invention has been described in detail with reference to particular embodiments thereof, but it will be understood that variations and modifications can be effected within the spirit and scope of the invention.

The invention claimed is:

1. An active component array, comprising:
   at least one printable electronic component comprising an active layer including at least one active element on a first surface thereof and a conductive element on a second surface thereof opposite the first surface, the conductive element on the second surface being configured to provide an electrical coupling to the at least one active element on the first surface, wherein the at least one printable electronic component includes a broken portion of a tether adjacent a periphery thereof; and
   a target substrate different from the active layer and including one or more electrical contacts on a surface thereof, wherein the at least one printable electronic component is printed on the target substrate such that the conductive element on the second surface thereof is in contact with a respective one of the electrical contacts on the surface of the substrate.

2. The active component array of claim 1, wherein the tether is configured to releasably adhere the at least one printable electronic component to an anchor portion of the active layer on a source substrate.

3. The active component array of claim 2, wherein the at least one printable electronic component comprises a plurality of electronic components printed on the target substrate, and wherein, in each of the electronic components, the first surface is configured to be adhered to a stamp to transfer the respective electronic component from the source substrate to the target substrate.

4. The active component array of claim 1, further comprising: an adhesive layer between the second surface of the at least one printable electronic component and the surface of the target substrate.

5. The active component array of claim 4, wherein the adhesive layer comprises a conductive layer between the conductive element of the at least one printable electronic component and the respective one of the electrical contacts.

6. The active component array of claim 5, wherein the adhesive layer comprises a material configured to transition between a nonconductive state and a conductive state responsive to curing thereof.

7. The active component array of claim 5, wherein the adhesive layer comprises a eutectic layer, a conductive film, and/or conductive nano-particles.

8. The active component array of claim 1, wherein the at least one printable electronic component includes a via extending therethrough from the first surface to the second surface, and wherein the conductive element extends through the via from the at least one active component on the first surface to the second surface.

9. The active component array of claim 8, wherein the conductive element protrudes from the second surface.

10. The active component array of claim 1, wherein the conductive element extends from the at least one active component on the first surface to the second surface around a periphery of the active layer.

11. The active component array of claim 1, wherein the conductive element is a diode comprising a first doped layer and a second doped layer having a conductivity type opposite that of the first doped layer.

12. The active component array of claim 1, wherein the target substrate includes conductive traces thereon, and wherein ones of the conductive traces are coupled to ones of the electrical contacts.

13. The active component array of claim 12, wherein the active layer comprises a crystalline, microcrystalline, polycrystalline, or amorphous semiconductor layer.

14. The active component array of claim 1, wherein the target substrate comprises a flexible and/or a polymer substrate.

15. The active component array of claim 1, wherein the target substrate including the at least one printable electronic component printed thereon defines a surface mount package for a chip-level device.

16. A method of fabricating an active component array, the method comprising:
   providing at least one printable electronic component comprising an active layer including at least one active element on a first surface thereof and a conductive element on a second surface thereof opposite the first surface, the conductive element on the second surface being configured to provide an electrical coupling to the at least one active element on the first surface, wherein the at least one printable electronic component includes a broken portion of a tether adjacent a periphery thereof; and
   printing the at least one printable electronic component on a target substrate different from the active layer and including one or more electrical contacts on a surface thereof such that the conductive element on the second surface of the at least one printable electronic component is in contact with a respective one of the electrical contacts.

17. The method of claim 16, wherein the tether is configured to releasably adhere the at least one printable electronic component to an anchor portion of the active layer on a source substrate.

18. The method of claim 17, wherein the at least one printable electronic component comprises a plurality of electronic components, and wherein printing comprises:
providing the plurality of electronic components releasably adhered to the source substrate by respective tethers;
pressing a stamp on the source substrate to break the respective tethers and adhere the first surface of each of the electronic components to the stamp;
aligning the stamp including the plurality of electronic components thereon with the electrical contacts on the surface of the target substrate;
pressing the stamp on the target substrate such that the conductive element on the second surface of each of the electronic components contacts a respective one of the electrical contacts on the surface of the target substrate; and
separating the stamp from the target substrate to print the plurality of electrical components thereon.

19. The method of claim 18, wherein providing the plurality of electronic components comprises:
providing the source substrate including a sacrificial layer thereon and the active layer on the sacrificial layer;
processing the active layer to define the plurality of electronic components respectively including the at least one active element on the first surface thereof, respective trenches extending around each of the electronic components, and the respective tethers connecting each of the electronic components to respective anchor portions of the active layer; and
removing portions of the sacrificial layer between the plurality of electronic components and the source substrate such that the plurality of electronic components are releasably adhered to the source substrate by the respective tethers.

20. The method of claim 18, wherein pressing the stamp on the target substrate is preceded by:
providing an adhesive layer between the second surface of each of the electronic components and the surface of the target substrate.

21. The method of claim 20, wherein the adhesive layer comprises a conductive layer provided between the conductive element of each of the electronic components and the respective one of the electrical contacts on the target substrate.

22. The method of claim 21, wherein separating the stamp from the target substrate is preceded by:
curing the adhesive layer to adhere the plurality of electronic components to the target substrate,
wherein an adhesive strength of the adhesive layer is greater than that used to adhere the first surface of each of the electronic components to the stamp.

23. The method of claim 22, wherein the adhesive layer comprises a material configured to transition between a non-conductive state and a conductive state responsive to the curing thereof.

24. The method of claim 23, wherein curing comprises selectively irradiating portions of the adhesive layer through the target substrate, the stamp, and/or the electronic components using light, heat, and/or electromagnetic energy.

25. The method of claim 22, wherein the adhesive layer comprises a eutectic layer, an anisotropic conductive film, and/or conductive nano-particles.

26. The method of claim 25, wherein the conductive nano-particles are provided in a colloid, and further comprising:
depositing the colloid on the surface of the target substrate using an inkjet dispenser or micro-dispenser to define the adhesive layer.

27. The method of claim 18, wherein each of the electrical contacts includes a eutectic layer, and further comprising:
reflowing the eutectic layer such that the conductive element on the second surface of each of the electronic components is in contact with the respective one of the electrical contacts 28. The method of claim 16, wherein the at least one printable electronic component includes a via extending therethrough from the first surface to the second surface, and wherein the conductive element extends through the via from the at least one active component on the first surface to the second surface.

29. The method of claim 16, wherein the conductive element extends from the at least one active component on the first surface to the second surface around a periphery of the active layer.

30. The method of claim 16, wherein the conductive element is a diode comprising a first doped layer and a second doped layer having a conductivity type opposite that of the first doped layer.

31. The method of claim 16, wherein the target substrate comprises a flexible and/or a polymer substrate, and wherein the active layer comprises a crystalline, microcrystalline, polycrystalline, or amorphous semiconductor layer.

32. The method of claim 16, wherein the at least one printable electronic component comprises at least one active-matrix pixel controller, light-emitting diode, photo-diode, edge laser, or photovoltaic element.

* * * * *

UNITED STATES PATENT AND TRADEMARK OFFICE
CERTIFICATE OF CORRECTION

| | | |
|---|---|---|
| PATENT NO. | : 9,049,797 B2 | Page 1 of 1 |
| APPLICATION NO. | : 13/638040 | |
| DATED | : June 2, 2015 | |
| INVENTOR(S) | : Menard et al. | |

It is certified that error appears in the above-identified patent and that said Letters Patent is hereby corrected as shown below:

IN THE SPECIFICATION

Column 10, Line 48: Delete "or other materials."
                Insert -- or other III-V materials. --

Signed and Sealed this
Ninth Day of February, 2016

Michelle K. Lee
*Director of the United States Patent and Trademark Office*